(12) United States Patent
Suh et al.

(10) Patent No.: US 9,360,531 B2
(45) Date of Patent: Jun. 7, 2016

(54) DEVICE FOR ESTIMATING A LIFETIME OF A SECONDARY BATTERY AND METHOD THEREOF

(75) Inventors: Seung Bum Suh, Yongin-si (KR); Heekwan Chai, Yongin-si (KR); Jeongsoon Shin, Yongin-si (KR); Younghwa Ko, Yongin-si (KR); Bounggun Joung, Yongin-si (KR); Kwangki Baeg, Yongin-si (KR); Cheol Ho Park, Yongin-si (KR); Yongsic Kim, Yongin-si (KR); Wonseok Kim, Yongin-si (KR); Hoyul Baek, Yongin-si (KR); Jang-Woo Lee, Yongin-si (KR); Jake Kim, Yongin-si (KR); Jongman Kim, Yongin-si (KR); Su Dong Lee, Yongin-si (KR); Seung Ho Yang, Yongin-si (KR); Inho Jung, Yongin-si (KR); Joo Han Song, Yongin-si (KR); Kyeong-Beom Cheong, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 662 days.

(21) Appl. No.: 13/450,421

(22) Filed: Apr. 18, 2012

(65) Prior Publication Data

US 2013/0166233 A1   Jun. 27, 2013

Related U.S. Application Data

(60) Provisional application No. 61/579,890, filed on Dec. 23, 2011.

(51) Int. Cl.
*G01R 31/36* (2006.01)

(52) U.S. Cl.
CPC ............ *G01R 31/3679* (2013.01); *G01R 31/36* (2013.01); *G01R 31/3606* (2013.01); *G01R 31/3648* (2013.01); *G01R 31/3651* (2013.01)

(58) Field of Classification Search
USPC .......................................................... 702/63
See application file for complete search history.

(56) References Cited

U.S. PATENT DOCUMENTS

| 5,061,898 | A  | * | 10/1991 | Oram et al. ................... 324/427 |
| 6,727,708 | B1 | * | 4/2004  | Dougherty et al. ........... 324/427 |
| 2002/0075003 | A1 | * | 6/2002  | Fridman et al. ............... 324/426 |
| 2004/0189257 | A1 | * | 9/2004  | Dougherty et al. ........... 320/132 |

(Continued)

FOREIGN PATENT DOCUMENTS

| JP | 10-255858   | 9/1998  |
| JP | 2002-345158 | 11/2002 |

(Continued)

OTHER PUBLICATIONS

Spotnitz, R., "Simulation of capacity fade in lithium-ion batteries", Journal of Power Sources, vol. 113, No. 1, Jan. 1, 2003, pp. 72-80.
Xing, Yinjiao, et al., "Prognostics an Health Monitoring of Lithium-ion Battery", Intelligence and Security Informatics (ISI), IEEE International Conference on Jul. 10, 2011, pp. 242-247.

(Continued)

*Primary Examiner* — Paul D Lee
(74) *Attorney, Agent, or Firm* — Lewis Roca Rothgerber Christie LLP

(57) ABSTRACT

Embodiments of the present invention provide an accelerated lifetime estimation device for predicting the lifetime of a secondary battery, and a method thereof. The accelerated lifetime estimation device can accurately estimate a normal lifetime of the secondary battery while reducing an evaluation time period of the secondary battery.

14 Claims, 18 Drawing Sheets

(56) References Cited

U.S. PATENT DOCUMENTS

| | | | |
|---|---|---|---|
| 2006/0166052 A1 | 7/2006 | Lee et al. | |
| 2010/0305770 A1* | 12/2010 | Bhowmik et al. | 700/295 |
| 2011/0060538 A1 | 3/2011 | Fahimi et al. | |

FOREIGN PATENT DOCUMENTS

| | | |
|---|---|---|
| JP | 2010-186704 | 8/2010 |
| KR | 10-2006-0085303 A | 7/2006 |

OTHER PUBLICATIONS

European Search Report dated Nov. 12, 2013 of the corresponding European Patent Application No. 12162201.3.

English Machine Translation of JP 10-255858 published Sep. 25, 1998, 7 pages.

English Machine Translation of JP 2002-345158 published Nov. 29, 2002, 21 pages.

English Machine Translation of JP 2010-186704 published Aug. 26, 2010, 13 pages.

\* cited by examiner

| Charge(C-rate) | Discharge (C-rate) | A(C-rate) | Acceleration Factor(AF) |
|---|---|---|---|
| 1.0 | 1.0 | 0.5773 | - |
| 2.0 | 2.0 | 0.6478 | 2 |

DEVICE FOR ESTIMATING A LIFETIME OF A SECONDARY BATTERY AND METHOD THEREOF

CROSS-REFERENCE TO RELATED APPLICATION

This application claims priority to and the benefit of U.S. Provisional Application No. 61/579,890, filed on Dec. 23, 2011, in the USPTO, the disclosure of which is incorporated herein in its entirety by reference.

FIELD

Embodiments of the present invention relate to a device for predicting the lifetime of a secondary battery and a method thereof.

BACKGROUND

In order to estimate a lifetime of a secondary battery during development of the secondary battery, charge and discharge operations are repeatedly performed under various conditions and time periods, which are similar to those for a case where the secondary battery is actually used, and a lifetime of the secondary battery is estimated by measuring a cycle life (residual capacity ratio) whenever measurement is made.

An amount of time required for evaluating the cycle life of the secondary battery is approximately 50% or greater of the entire amount of time required for the development of the secondary battery. Thus, the evaluation of the cycle life of the secondary battery is an important factor in reducing the amount of time required for the development of the secondary battery.

In particular, in view of the short product cycle of the IT fields as compared to products of other fields, it is quite desirable to reduce the amount of time for cycle life evaluation.

SUMMARY

An embodiment of the present invention provides a device for estimating a lifetime of a secondary battery. The device includes an input unit configured to receive first battery life test data and second battery life test data of the secondary battery, the first battery life test data and the second battery life test data corresponding to different conditions; and a processor operatively coupled with the input unit, the processor being configured to determine one or more parameters from the first battery life test data and the second battery life test data, determine an acceleration factor (AF) correlating the first battery life test data and the second battery life test data in accordance with the one or more parameters, and predict an estimated lifetime of the secondary battery in accordance with the AF and the second battery life test data.

The first battery life test data may be obtained by charging and/or discharging a first battery with a first current, and the second battery life test data may be obtained by charging and/or discharging a second battery with a second current greater than the first current.

The first battery life test data may be obtained by charging and/or discharging the first battery at a first temperature for a first period, and the second battery life test data may be obtained by charging and/or discharging the second battery at a second temperature for a second period, the second temperature being higher or lower than the first temperature, or the second temperature being equal to the first temperature, and the second period being shorter or longer than the first period, or the second period being equal to the first period.

Each of the first battery life test data and the second battery life test data may include at least one of cycle numbers, residual capacity ratios, charge and/or discharge currents, and charge and/or discharge cut-off voltages.

The processor may include a parameter extractor configured to extract the one or more parameters from the first battery life test data and the second battery life test data, an acceleration factor calculator configured to calculate the AF in accordance with the one or more parameters, and a prediction unit configured to predict the estimated lifetime of the secondary battery in accordance with the AF. The parameter extractor may be configured to determine a slope parameter for a residual capacity ratio relative to cycle numbers in accordance with the first battery life test data and the second battery life test data. The acceleration factor calculator may be configured to calculate the AF using the one or more parameters in accordance with a semi-empirical lifetime model of the secondary battery or a statistical lifetime analysis model of the secondary battery. The first battery life test data may include cycle and capacity values obtained by charging and/or discharging the first battery with a first voltage, and the second battery life test data may include cycle and capacity values obtained by charging and/or discharging the second battery with a second voltage, the second voltage being higher or lower than the first voltage, or the second voltage is equal to the first voltage.

The processor may be configured to multiply the second battery life test data by the AF to determine the estimated lifetime of the secondary battery.

The device may further include a storage device configured to store one or more of the first battery life test data, the second battery life test data, the one or more parameters, the AF, and the estimated lifetime of the secondary battery.

Another embodiment of the present invention provides a method of estimating a lifetime of a secondary battery. The method includes determining one or more parameters from first battery life test data and second battery life test data of the secondary battery, the first battery life test data and the second battery life test data corresponding to different conditions; determining an acceleration factor (AF) that correlates the first battery life test data and the second battery life test data in accordance with the one or more parameters; and predicting an estimated lifetime of the secondary battery in accordance with the AF and the second battery life test data.

The method may further include obtaining the first battery life test data by charging and/or discharging a first battery with a first current, and obtaining the second battery life test data by charging and/or discharging a second battery with a second current greater than the first current.

The method may further include obtaining the first battery life test data by charging and/or discharging a first battery at a first temperature for a first period, and obtaining the second battery life test data by charging and/or discharging a second battery at a second temperature for a second period, wherein the second temperature is higher or lower than the first temperature, or the second temperature is equal to the first temperature, and the second period is shorter or longer than the first period, or the second period is equal to the first period.

Each of the first battery life test data and the second battery life test data may include at least one of cycle numbers, residual capacity ratios, charge/discharge currents, and charge/discharge cut-off voltages.

The determining the one or more parameters may include determining a slope parameter for a residual capacity ratio relative to cycle numbers in accordance with the first battery life test data and the second battery life test data. The determining the AF may include calculating the AF by using the one or more parameters in accordance with a semi-empirical lifetime model or a statistical lifetime analysis model of the secondary battery. The predicting the estimated lifetime of the secondary battery may include multiplying the second battery life test data by the AF to determine the estimated lifetime of the secondary battery.

DETAILED DESCRIPTION OF EMBODIMENTS

Hereinafter, examples of embodiments of the invention will be described in detail with reference to the accompanying drawings such that they can easily be made and used by those skilled in the art.

Figure 1:
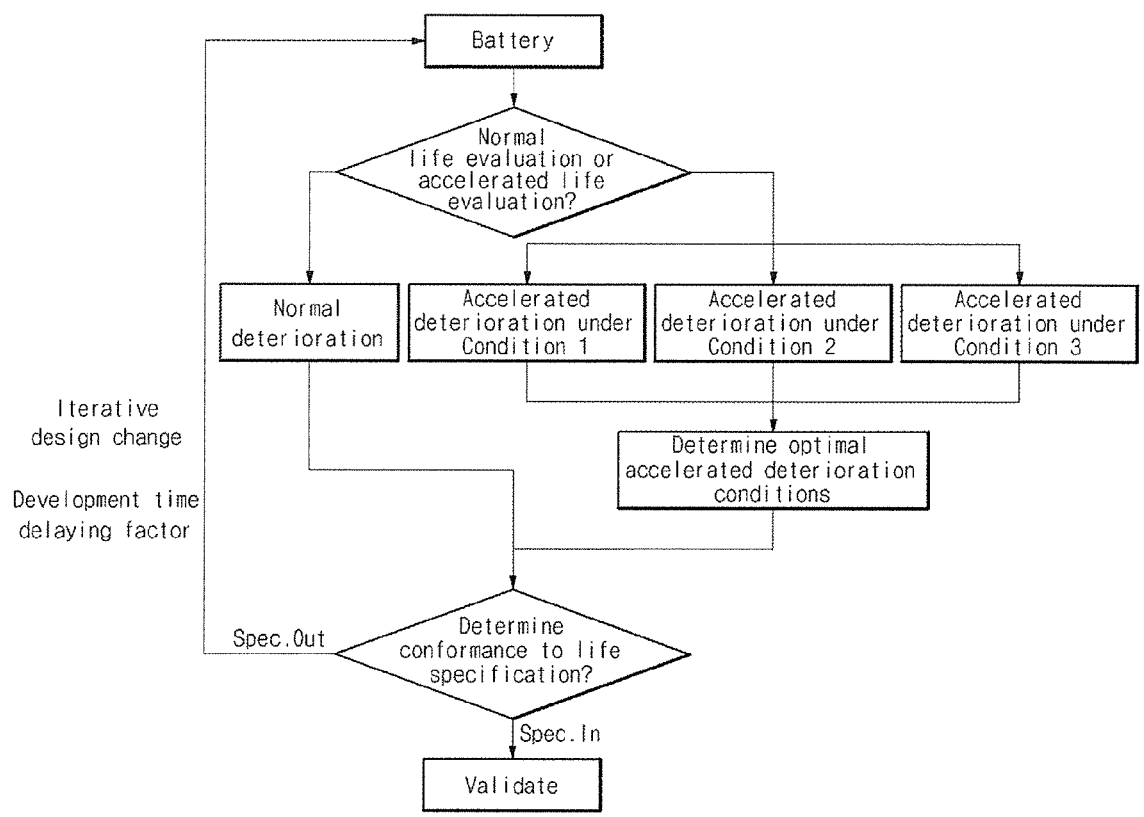
FIG. 1 is a conceptual diagram illustrating a flowchart of battery lifetime estimation using an accelerated lifetime estimation method for predicting the lifetime of a secondary battery according to an embodiment of the present invention.

FIG. 1 is a conceptual diagram illustrating a flowchart of battery lifetime estimation using an accelerated lifetime estimation method for predicting the lifetime of a secondary battery according to an embodiment of the present invention.

As shown in FIG. 1, the secondary battery manufactured according to various and complex specification factors is subjected to lifetime evaluation by a normal lifetime estimation method or an accelerated lifetime estimation method according to an embodiment of the present invention.

In the normal lifetime estimation method, a lifetime (residual capacity ratio) of the secondary battery is evaluated while the secondary battery is allowed to deteriorate under normal conditions. In the accelerated lifetime estimation method according to an embodiment of the present invention, a cycle life (residual capacity ratio) of the secondary battery is evaluated while the secondary battery is allowed to deteriorate under accelerated conditions.

In the accelerated lifetime estimation method, compared to the normal lifetime estimation method, charge and/or discharge currents, charge and/or discharge cut-off voltages, temperature and shelf time are adjusted, thereby reducing an accelerated lifetime evaluation time as compared to a normal evaluation time. In other words, an accelerated state is severer than a normal state. Accordingly, the secondary battery deteriorates relatively faster, so that the lifetime evaluation time of the battery becomes shortened.

Here, the conditions for the accelerated lifetime estimation method and the normal lifetime estimation method of the battery may vary according to various types of batteries. The battery is typically classified into a prismatic battery, a pouch type battery, and a cylindrical battery. In addition, since batteries of the same type may have different materials and composition ratios, evaluation conditions optimized according to characteristics of the battery manufactured are empirically determined.

In addition, if the cycle life of a battery is predicted according to normal conditions and accelerated conditions according to the present invention, and it is determined that the predicted cycle life of the battery lies in a lifetime tolerance range (Spec In), batteries can be manufactured according to the same various and complex specification factors of the tested battery. If it is determined that the predicted cycle life of the battery lies outside of a lifetime tolerance range (Spec Out), the various and complex specification factors of the tested battery are varied to manufacture batteries with the desired cycle life.

Figure 2:
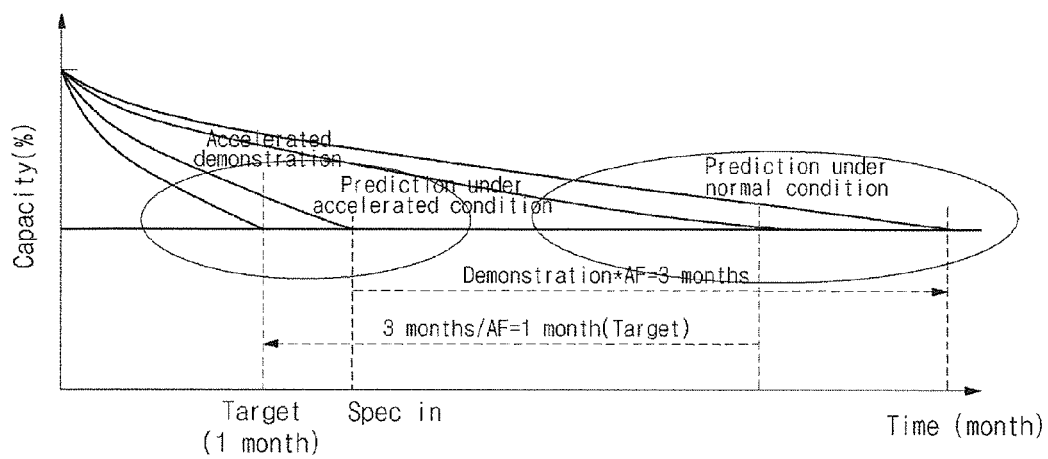
FIG. 2 is a conceptual diagram illustrating an accelerated lifetime estimation method for predicting the lifetime of a secondary battery according to an embodiment of the present invention.

FIG. 2 is a conceptual diagram illustrating an accelerated lifetime estimation method for predicting the lifetime of a battery according to an embodiment of the present invention, where the X axis indicates an evaluation time period (e.g., month) of a battery and the Y axis indicates a cycle life (residual capacity ratio (%)) of the battery.

As shown in FIG. 2, in order to measure a cycle life (residual capacity ratio) under normal conditions requested by a customer (e.g., a manufacturing company of an electronic product having a secondary battery mounted therein), an evaluation period of approximately 3 months may be required, which is, however, detrimental to an IT product having a very short cycle life. To overcome the shortcoming, embodiments of the present invention provide an accelerated lifetime estimation device for predicting the lifetime of a battery and a method thereof. For example, data of an accelerated lifetime estimation of a battery for approximately 1 month can be used in obtaining normal lifetime data of the battery. Here, in order to obtain the normal lifetime data from the accelerated lifetime data, an acceleration factor (AF) is used, which will be described below in more detail.

FIGS. 3a to 3f are detailed conceptual diagrams illustrating an accelerated lifetime estimation method for predicting the lifetime of a battery according to an embodiment of the present invention, in which the X axis indicates the evaluation time period, and the Y axis indicates residual capacity ratio (%) of the battery.

Figure 3A:
FIGS. 3a to 3f are detailed conceptual diagrams illustrating an accelerated lifetime estimation method for predicting the lifetime of a secondary battery according to an embodiment of the present invention.

As shown in FIG. 3a, in order to determine whether a normal lifetime of a battery lies in a tolerance range (Spec In) or outside of a tolerance range (Spec Out), it is necessary to measure an actual cycle life (residual capacity ratio) of a battery relative to the number of charging and/or discharging cycles. In order to measure the actual cycle life (residual capacity ratio) of a battery relative to the number of charging and/or discharging cycles, a considerable amount of time is required. Here, the tolerance range is based on the amount of time taken when the capacity of the battery is reduced to approximately 80%.

Figure 3B:
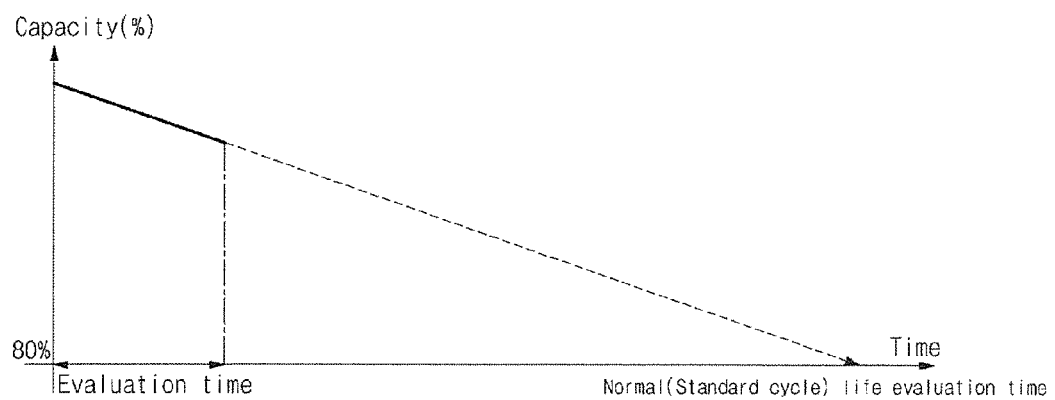

As shown in FIG. 3b, in order to reduce a lifetime evaluation time period of a battery, actual evaluation is conducted for a relatively short amount of time, and a residual lifetime can be predicted through data obtained for the short amount of time during the actual evaluation.

Figure 3C:
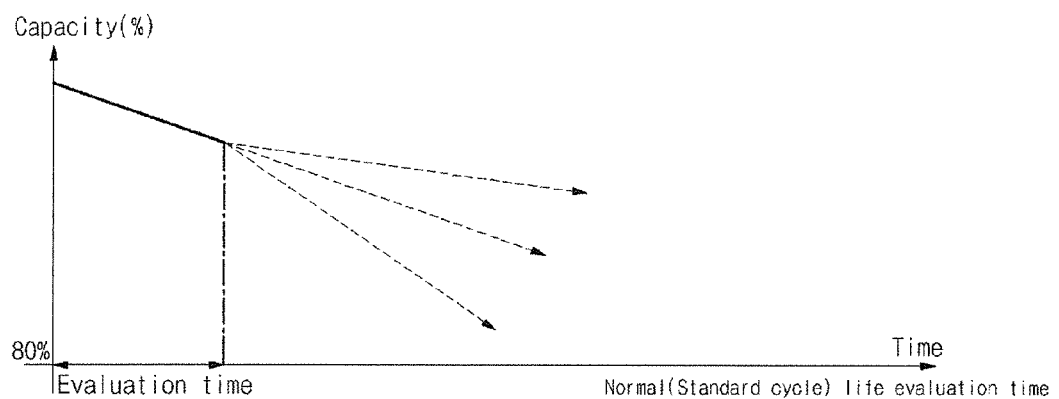

However, as shown in FIG. 3c, it may not be accurately predicted in which direction the deterioration of the battery occurs.

Figure 3D:
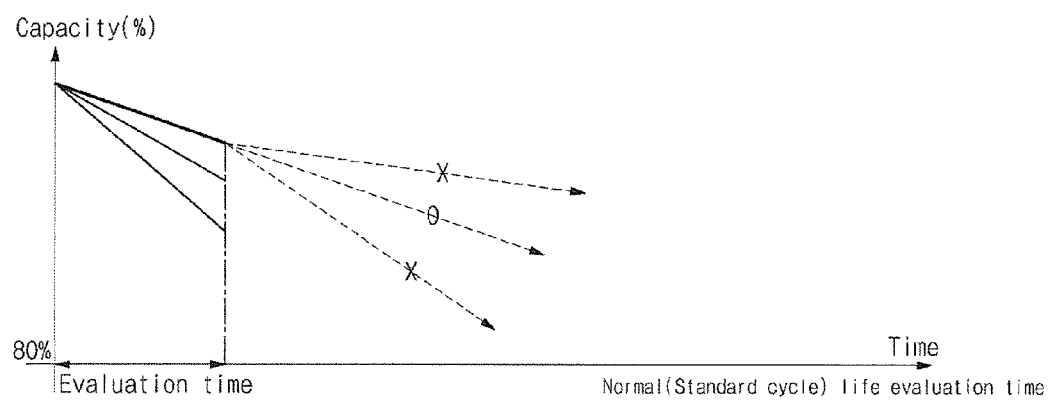

Thus, as shown in FIG. 3d, data of the cycle life (residual capacity ratio) of a battery may be measured under normal and accelerated conditions, and an equation for lifetime prediction under normal conditions may be derived from the data.

Figure 3E:
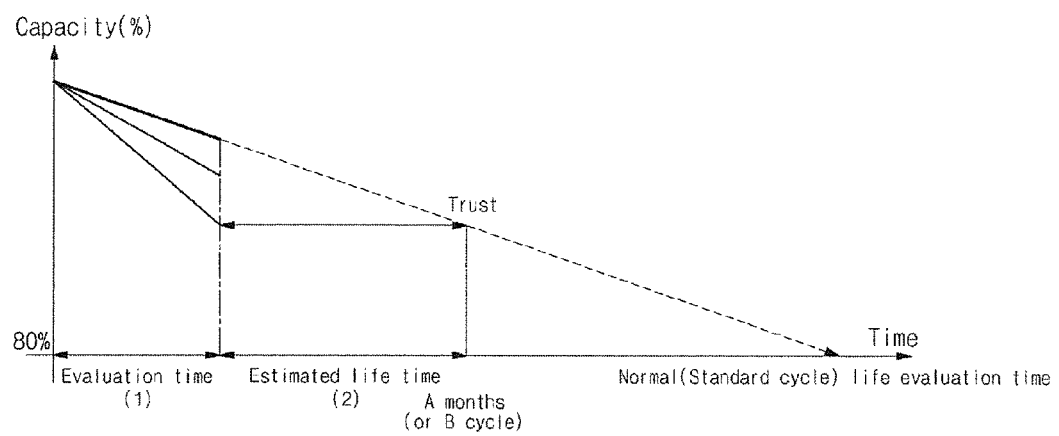

As shown in FIG. 3e, an evaluation time period (1) under accelerated conditions can be extended to an estimated lifetime (2) under normal conditions. That is to say, the relatively long estimated lifetime (2) can be obtained using the relatively short evaluation time period (1). Here, the time period may be a number of months or cycles. The sum of the estimated lifetime (2) and the evaluation time period (1) is obtained through multiplying the evaluation time period (1) by the acceleration factor (AF).

Figure 3F:
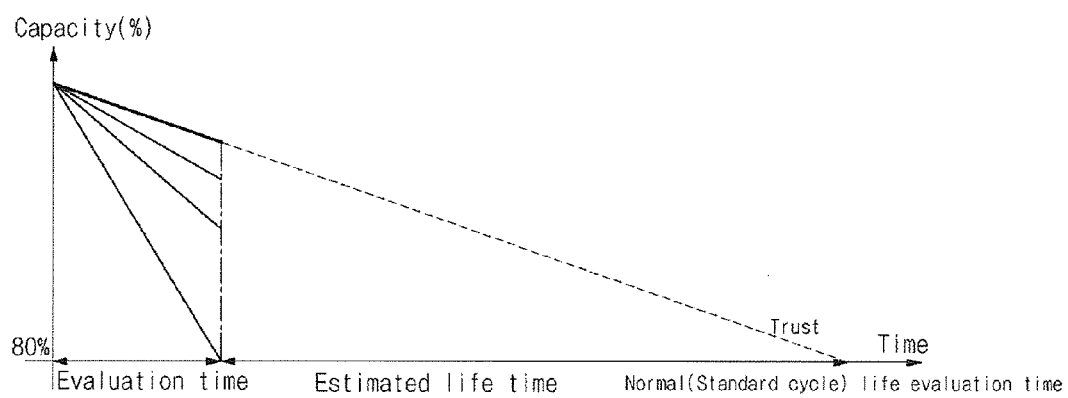

As shown in FIG. 3f, if the lifetime of the secondary battery is evaluated under severer accelerated conditions, a reliable period for an estimated lifetime can be further extended.

The present invention will be described in more detail based on several embodiments of the present invention.

Figure 4:
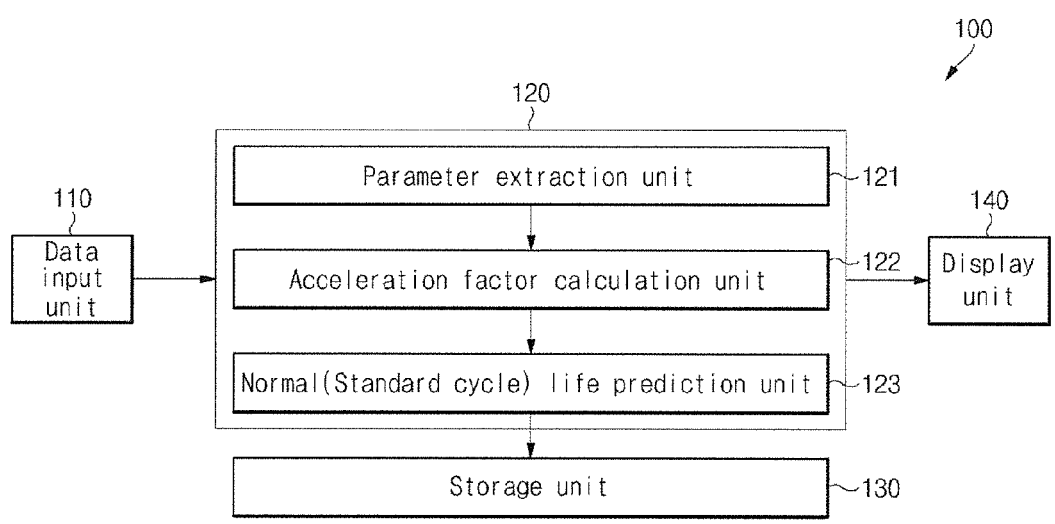
FIG. 4 is a block diagram of an accelerated lifetime estimation device for predicting the lifetime of a secondary battery according to an embodiment of the present invention.

FIG. 4 is a block diagram of an accelerated lifetime estimation device for predicting the lifetime of a battery according to an embodiment of the present invention.

As shown in FIG. 4, an accelerated lifetime estimation device 100 according to an embodiment of the invention includes a data input unit 110, a data processing unit 120 (e.g., a processor), a storage unit 130, and a display unit 140. In one embodiment, the accelerated lifetime estimation device 100 can be implemented by a personal computer, a server computer, and equivalents thereof, but aspects of the present invention are not limited thereto.

Normal lifetime test data (e.g., first battery life test data of a first battery) obtained from a test conducted for a given amount of time, such as residual capacity ratio, cycle numbers, charge and/or discharge currents, charge and/or discharge cut-off voltage, or the like, may be input to the data input unit 110. In addition, accelerated lifetime test data (e.g., second battery life test data of a second battery) obtained from a test conducted for a given amount of time, such as residual capacity ratio, cycle numbers, charge and/or discharge currents, charge and/or discharge cut-off voltages, or the like, may also be input to the data input unit 110. The data may be automatically input from a test, measurement, or evaluation device, or may be manually input using a keyboard or mouse.

In addition, the data may be obtained by a cycle method or an interval method, which will be described below in more detail.

The data processing unit 120 includes a parameter extraction unit 121, an acceleration factor calculation unit 122 (e.g., acceleration factor calculator) and a normal (or standard) cycle lifetime prediction unit 123. The data processing unit 120 may be implemented by a program running on a computer, software and equivalents thereof, but aspects of the present invention are not limited thereto.

The parameter extraction unit 121 may extract a slope parameter A for a residual capacity ratio relative to cycles from the input normal lifetime test data and the data of accelerated lifetime test. In addition, the parameter extraction unit 121 may simply extract the cycle numbers and residual capacity ratio.

In addition, the acceleration factor calculation unit 122 calculates the acceleration factor (AF) using the extracted parameters and an equation associated with a semi-empirical lifetime model or an equation associated with a statistical lifetime analysis model, which will be described below.

Finally, the normal (or standard) cycle lifetime prediction unit 123 estimates a normal (or standard) cycle lifetime of the secondary battery from a residual capacity ratio relative to a duration of time (number of months or cycles).

For example, a normal (or standard) cycle life, which is substantially the same as that obtained from 3 month data, may be estimated using one month data.

Here, the storage unit 130 stores various kinds of data of the data input unit 110 and the data processing unit 120. That is to say, the storage unit 130 stores the test data input from the data input unit 110, the parameters, the acceleration factor (AF) and the estimated normal (or standard) cycle lifetime data. The storage unit 130 may be generally a hard disk, a flash memory, a CD-ROM, and equivalents thereof, but aspects of the present invention are not limited thereto.

In addition, the display unit 140 displays various kinds of data of the data input unit 110 and the data processing unit 120. That is to say, the display unit 140 displays not only the test data input to the data input unit 110, but also the parameter, the acceleration factor (AF), and the estimated normal (or standard) cycle lifetime data. The display unit 140 may be generally an LCD monitor and equivalents thereof, but aspects of the present invention are not limited thereto.

The operation of the accelerated lifetime estimation device will be described in more detail through the accelerated lifetime estimation method that follows.

Figure 5:
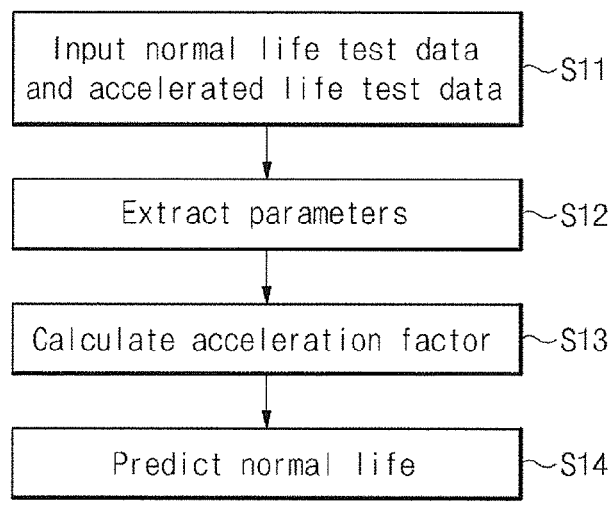
FIG. 5 is a flowchart illustrating an accelerated lifetime estimation method for predicting the lifetime of a secondary battery according to an embodiment of the present invention.

FIG. 5 is a flowchart illustrating an accelerated lifetime estimation method for predicting the lifetime of a secondary battery according to an embodiment of the present invention.

As shown in FIG. 5, the accelerated lifetime estimation method according to an embodiment of the present invention includes a data input step (S11), a parameter extraction step (S12), an acceleration factor calculation step (S13), and a normal (or standard) cycle lifetime estimation step (S14). Here, in the data input step (S11), normal lifetime test data (e.g., first battery lifetime test data) and accelerated lifetime test data (e.g., second battery lifetime test data) are input.

FIGS. 6a to 6e illustrate an example of an accelerated lifetime estimation method for predicting the lifetime of a secondary battery according to an embodiment of the present invention.

Figure 6A:
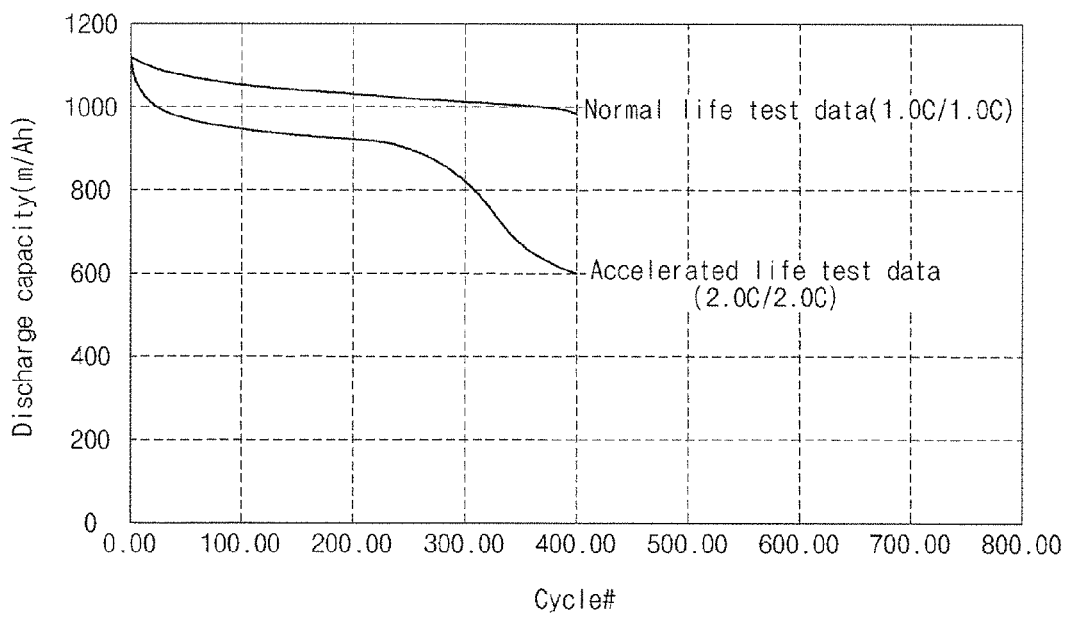
FIGS. 6a to 6e illustrate an example of an accelerated lifetime estimation method for predicting the lifetime of a secondary battery according to an embodiment of the present invention.

As shown in FIG. 6a, in the data input step (S11), normal lifetime test data of the first battery and accelerated lifetime test data of the second battery are illustrated for the capacity (mAh) relative to the number of charge and/or discharge cycles.

Here, the charge and/or discharge currents and charge and/or discharge cut-off voltages for accelerated lifetime tests may be set to be higher than those for normal lifetime tests. Therefore, as the number of charge and/or discharge cycles of the secondary battery increases, while the capacity of the secondary battery slowly decreases at the normal lifetime test data curve, the capacity of the secondary battery sharply decreases at the accelerated lifetime test data curve. The charge and/or discharge currents 1.0 C/1.0 C for the normal lifetime test data shown in FIGS. 6a and 6b, and the charge and/or discharge currents 2.0 C/2.0 C for the accelerated lifetime test data shown in FIG. 6c are provided only for a better understanding of the present invention, but the present invention does not limit values of the charge and/or discharge currents to those values stated herein.

Here, the accelerated lifetime test data can be generally obtained by a cycle method or an interval method.

First, in the cycle method, the cycle life (residual capacity ratio) characteristics of the secondary battery are measured according to the number of charge and/or discharge cycles, and the accelerated lifetime tests are conducted under other conditions while increasing the charge and/or discharge currents.

In one example, while the normal lifetime test data may be values obtained by charging and/or discharging the first battery with a first current of approximately 1.0 C per cycle, the accelerated lifetime test data may be values obtained by charging and/or discharging the second battery with a second current of approximately 2.0 C per cycle. As described above, the present invention is not limited to the currents stated herein, which are provided only for a better understanding of the present invention. Further, the normal lifetime test data may include cycle and capacity values obtained by charging and/or discharging the first battery with a first voltage, and the accelerated lifetime test data may include cycle and capacity values obtained by charging and/or discharging the second battery with a second voltage higher or lower than the first voltage. Furthermore, when the first current is different from the second current, the first voltage may be equal to the second voltage. In addition, the cycle method may be applied to a prismatic battery or a pouch type battery, but aspects of the present invention are not limited thereto. The cycle method may also be applied to a cylindrical battery.

Next, in the interval method, accelerated lifetime tests are conducted by allowing the secondary battery to be left at a set or predetermined temperature (e.g., at room temperature such as 25° C. or a temperature higher than room temperature) for a set or predetermined amount of time.

In one example, while the normal lifetime test data may be values obtained from the first battery left at a first temperature for a first time period, the accelerated lifetime test data may be values obtained by leaving the second battery at a second temperature that is higher or lower than the first temperature for a second time period shorter or longer than the first time period. Furthermore, when the first period is different from the second period, the first temperature may be equal to the second temperature, and when the first temperature is different from the second temperature, the first period may be equal to the second period.

The accelerated lifetime test data may be obtained under the same conditions as the normal lifetime test conditions while slightly increasing only the acceleration factor. In addition, the interval method may be applied to a cylindrical battery, but aspects of the present invention are not limited thereto. The interval method may also be applied to a prismatic battery and a pouch type battery.

The cylindrical battery has a current interrupt device installed therein. Therefore, like in the cycle method, when the cylindrical battery is subjected to lifetime tests with increased charge and/or discharge currents and cut-off voltages, the current interrupt device may operate, making the cylindrical battery difficult to be tested in the cycle method.

Figure 6B:
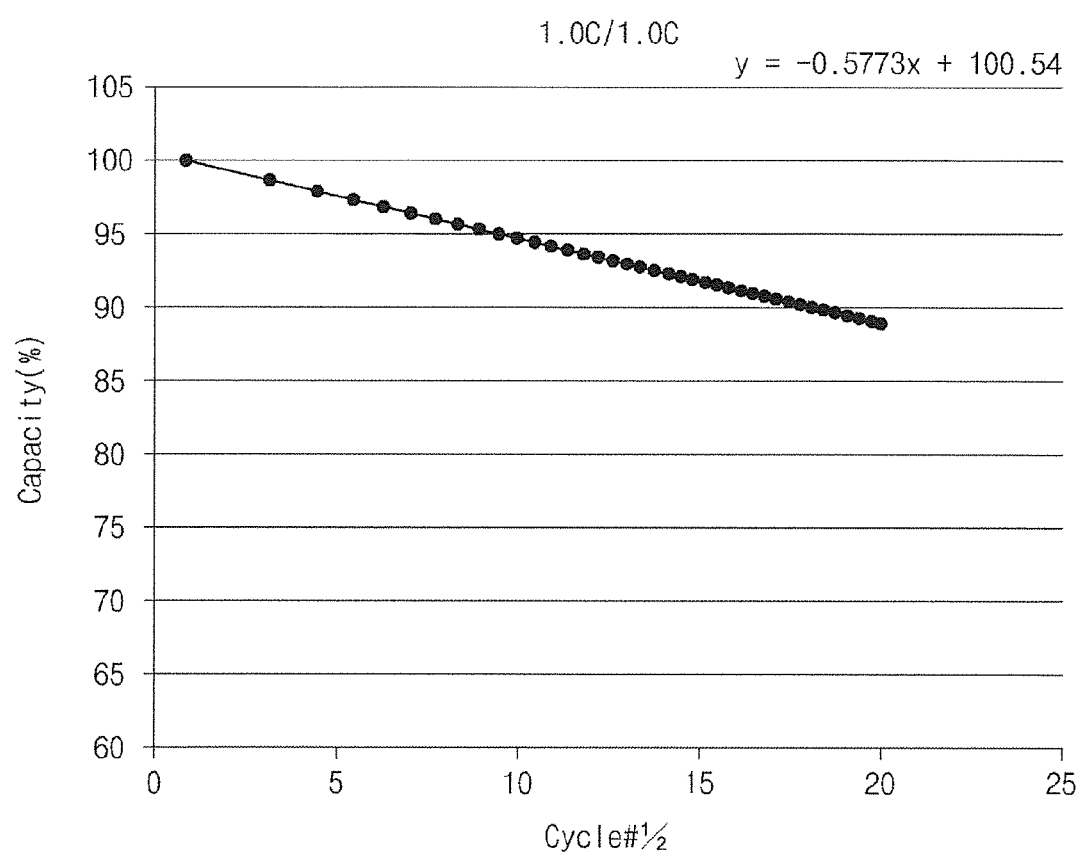
Figures 6C, 6D:
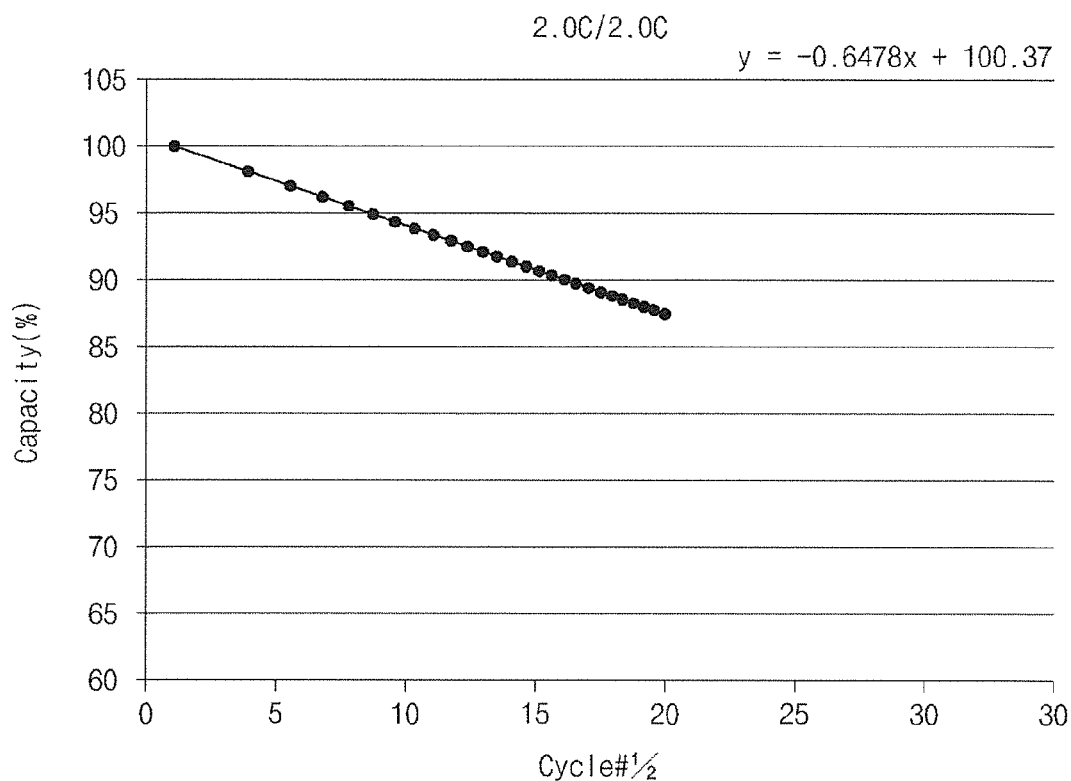

As shown in FIGS. 6b and 6c, in the parameter extraction step (S12), slope parameters A are extracted from the input normal lifetime test data and accelerated lifetime test data, respectively. Here, FIG. 6b illustrates the transformation result for the normal lifetime test data, and FIG. 6c illustrates the transformation result for the accelerated lifetime test data.

As shown in FIGS. 6b and 6c, the capacity is transformed from mAh unit to % unit, and the cycle number is transformed from N to $N^{1/2}$. For example, the discharge capacity of 1100 mAh is transformed to 100%, and the cycle number is transformed from 400 to 20.

In addition, the input data are transformed into substantially linear forms using a model equation, y=Ax+B, as shown in FIGS. 6b and 6c. Of course, a section in which the capacity linearly varies is selected from the transformed data and the slope parameter A is extracted.

In one example, referring to FIG. 6b, the slope parameter A of 0.5773 was extracted by: y=−0.5773x+100.54. In one example, referring to FIG. 6c, the slope parameter A of 0.6478 was extracted by: y=−0.6478x+100.37.

As shown in FIG. 6d, in the acceleration factor calculation step (S13), the acceleration factor (AF) is calculated using the extracted slope parameter A and the equation below. Here, the acceleration factor (AF) for the normal lifetime test data is not calculated.

In one example, based on the following semi-empirical lifetime model, the acceleration factor (AF) can be calculated. Here, before explaining the equation associated with the acceleration factor (AF), the semi-empirical lifetime model associated with the capacity and cycle numbers will first be described.

The inventors of the present invention discovered that the capacity of the secondary battery could be semi-empirically defined as:

$$\text{Capacity} = C_0 \times (1 - A(C\text{-rate, Swing, middle SOC}) \times (\text{Cycle}\#)^{1/2}) \qquad (1)$$

where $C_0$ is an initial capacity, A is a slope parameter, C-rate is a charge and/or discharge current, Swing is a charge and/or discharge cut-off voltage, middle SOC is a middle state of charge (SOC) (e.g., 80%), and Cycle# is a number of charge and/or discharge cycles.

As shown in the equation (1), the larger the slope parameter A or the number of charge and/or discharge cycles, which is affected by the charge and/or discharge current and cut-off voltage, the smaller the capacity of the secondary battery. That is to say, as the charge and/or discharge current and cycle numbers become large, the capacity of the secondary battery is sharply reduced.

Here, the inventors of the present invention discovered that the number of cycles (Cycle#) of the secondary battery and time t(day) could be semi-empirically defined as:

$$\text{Cycle}\# = \frac{12 \text{ cycle}\#}{1C\text{-rate} \times 1\text{day}} \times (C\text{-rate}) \times \left(\frac{50\%}{\text{Swing \%}}\right) \times t(\text{day}) \qquad (2)$$

As shown in the equation (2), the number of cycles (Cycle#) of the secondary battery increases as the charge and/or discharge current (C-rate) and the time t(day) increase.

Finally, the inventors of the present invention discovered that the acceleration factor (AF) could be calculated using the equations (1) and (2) as:

$$AF = \frac{t(\text{normal})}{t(\text{accelerated})} = \qquad (3)$$
$$\frac{C\text{-rate}(a)}{C\text{-rate}(n)} \times \frac{\text{Swing}(n)}{\text{Swing}(a)} \times \left(\frac{A_a(c\text{-rate}(a), \text{Swing}(a))}{A_n(C\text{-rate}(n), \text{Swing}(n))}\right)^2$$

where the acceleration factor (AF) is a ratio of the normal lifetime test time period relative to the accelerated lifetime test time period, which may be calculated by the charge and/or discharge current (C-rate), the charge and/or discharge cut-off voltage, and the slope parameter A.

In equation (3), t(normal) is a normal lifetime test time period, t(accelerated) is an accelerated lifetime test time period, C-rate(n) is the charge and/or discharge current for the normal lifetime test, C-rate(a) is the charge and/or discharge current for the accelerated lifetime test, Swing(n) is the cut-off voltage for the normal lifetime test, Swing(a) is the cut-off voltage for the accelerated lifetime test, $A_n$ is the slope parameter defining a slope of a graph of battery capacity against cycle numbers at the normal lifetime test, which depends on the current and cut-off voltage, and $A_a$ is a slope parameter defining a slope of a graph of battery capacity against cycle numbers at the accelerated lifetime test, which depends on the current and cut-off voltage, as described above.

Although not shown, the parameter extraction step (S12) and the acceleration factor calculation step (S13) may be performed using a statistical lifetime analysis model.

The normal lifetime test data and the accelerated lifetime test data are interpreted by a statistical method to calculate the acceleration factor (AF). That is to say, a least square method is applied to the normal lifetime test data and the accelerated lifetime test data for the same capacity, thereby calculating the acceleration factor (AF).

In one example, first, in the parameter extraction step (S12), ($x_n$, $y_n$) and ($x_a$, $y_a$) are extracted from the normal lifetime test data and the accelerated lifetime test data of the secondary battery, respectively. Here, n denotes normal lifetime test conditions, a denotes accelerated lifetime test conditions, x denotes cycle numbers (cycle#), and y denotes a cycle life (residual capacity ratio) of the secondary battery.

In addition, in the acceleration factor calculation step (S13), the acceleration factor (AF) can be obtained through comparison and analysis of cycles of the normal lifetime test data and the accelerated lifetime test data for the same capacity. Here, the least square method is used. To this end, a linear equation is obtained from the extracted ($x_n$, $y_n$) and ($x_a$, $y_a$). In one example, a linear equation for a normal cycle life can be obtained using the following equation:

$$f(x_n) = a_n + b_n(kx_a - x_n), \quad x_{n-1} \leq x_n < x_{n+1} \quad (4)$$

where $a_n$ denotes the y-intercept, $b_n$ denotes a slope between data of the battery capacity and cycle numbers at the normal lifetime test, and k denotes a deteriorated acceleration factor. The least square method is applied to the normal lifetime test data and the accelerated lifetime test data for the same capacity, and the deteriorated acceleration factor k is obtained using the following equation:

$$k = \frac{\sum [b_n x_a y_a - a_n b_n x_a + b_n^2 x_n x_a]}{\sum [b_n x_a]^2} \quad (5)$$

The acceleration factor (AF) can be calculated by the calculated deteriorated acceleration factor k using the following equation:

$$AF = k \times \frac{C - \text{rate}(a)}{C - \text{rate}(n)} \text{ or } k \times (\text{time\_ratio}) \quad (6)$$

where C-rate(n) is a charge and/or discharge current used in a normal lifetime test, C-rate(a) is a charge and/or discharge current used in an accelerated lifetime test, and time_ratio is a ratio of an evaluation time period to initial 100 cycles.

As described above, according to an embodiment of the present invention, the acceleration factor (AF) can be obtained to indicate how much normal lifetime test data is accelerated relative to the accelerated lifetime test data. Since the acceleration factor (AF) is a ratio of a normal lifetime test time period to an accelerated lifetime test time period, it can be used as one of a number of barometers for interpreting a reduced evaluation time.

For example, in a case where the acceleration factor (AF) is 4, if the normal lifetime test time is 160 days, then the accelerated lifetime test time is 40 days, meaning that in a case of the accelerated lifetime test, it takes 40 days to predict a normal lifetime of 160 days.

Figure 6E:
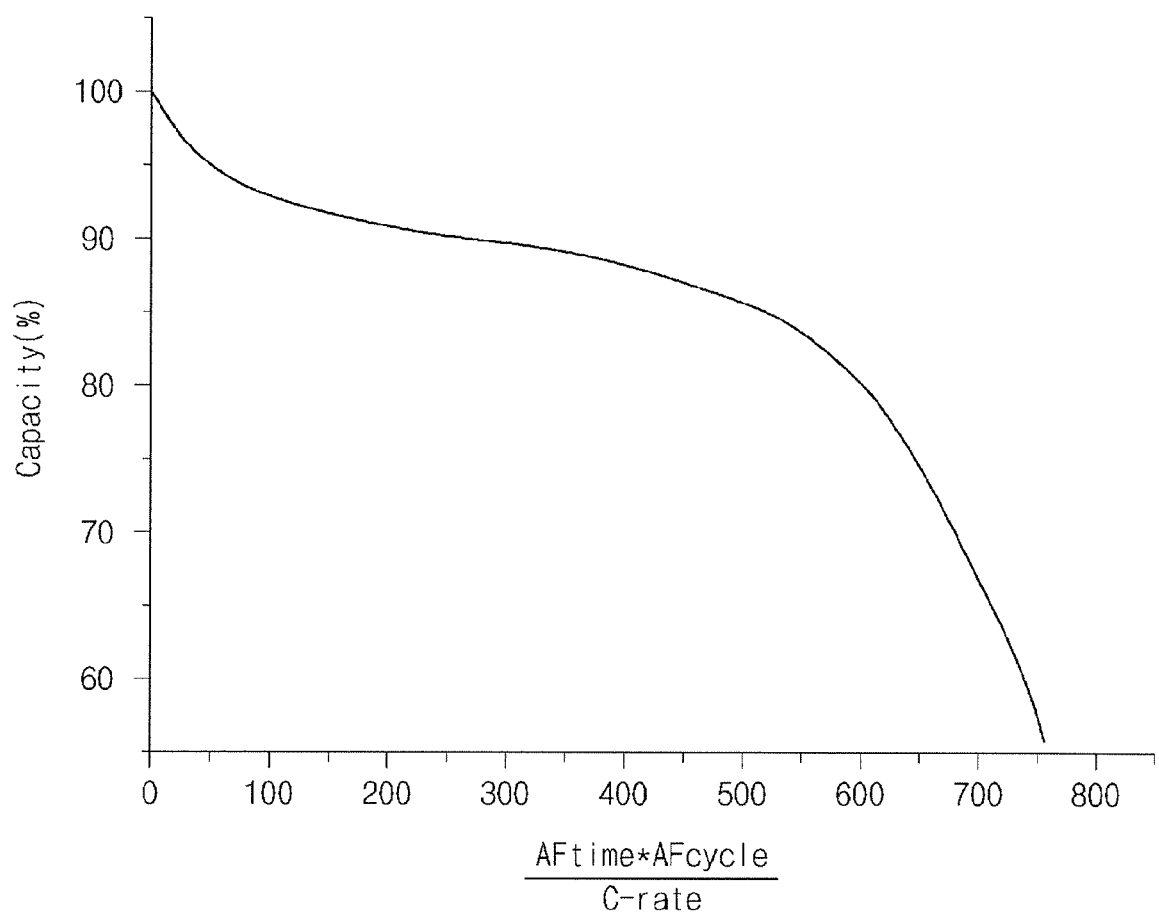

Referring to FIG. 6e, in the normal lifetime prediction step (S14), the acceleration factor (AF) is multiplied with accelerated lifetime test data to obtain a normal lifetime curve of the secondary battery. Here, the Y axis is converted into capacity (%), and the X axis is converted into a product of an amount of time (days) and/or a cycle number. In more detail, the X axis may be converted to $AF_{time} * AF_{cycle}/\text{C-rate}$, which will be briefly described below.

The acceleration factor (AF), consisting of AF time and AF cycle, may be defined as:

$$AF = AF_{time} * AF_{cycle} \quad (7)$$

That is to say, $AF_{time}$ and $AF_{cycle}$ may be defined by the equations (8) and (9) below, respectively:

$$AF_{time} = \frac{C - \text{rate}(a)}{C - \text{rate}(n)} \quad (8)$$

$$AF_{cycle} = \frac{\text{Swing}(n)}{\text{Swing}(a)} \times \left( \frac{A_a(C - \text{rate}(a), \text{Swing}(a))}{A_n(C - \text{rate}(n), \text{Swing}(n))} \right)^2 \text{ or} \quad (9)$$

$$\frac{\sum [b_n x_a y_a - a_n b_n x_a + b_n^2 x_n x_a]}{\sum [b_n x_a]^2}$$

Therefore, as shown in FIG. 6e, when the X axis is converted to a product of time (acceleration factor $(AF)_{time}$) and cycle (acceleration factor $(AF)_{cycle}$), since a time required for each cycle of charging and discharging varies according to the C-rate, $AF_{time} * AF_{cycle}$ may be divided by C-rate.

As described above, according to embodiments of the present invention, the lifetime evaluation time period of the secondary battery can be reduced, and a normal cycle life can be accurately predicted under the estimated accelerated conditions.

In addition, according to embodiments of the present invention, lifetime prediction of the secondary battery can be achieved within a relatively short amount of time, thereby reducing the overall development time period of the secondary battery.

Here, in the above-described accelerated lifetime estimation method, it is important for capacities obtained under normal and accelerated lifetime test conditions to follow the same change tendency. To this end, the inventors of the present invention demonstrated by analyzing the capacity profile, discharge curve and decomposition of a secondary battery, which will now be described.

Figure 7A:
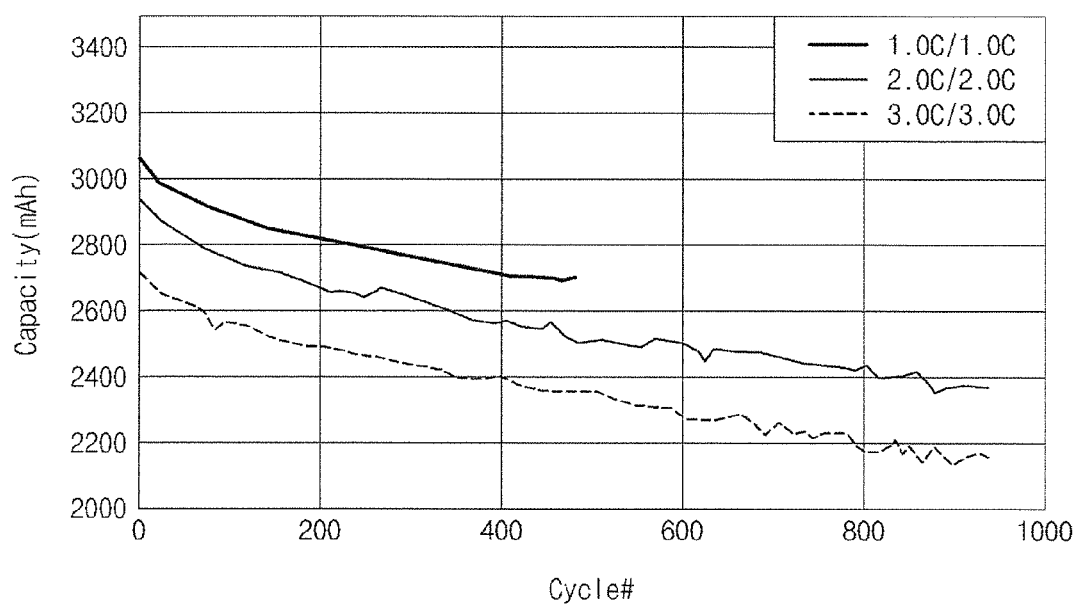
FIGS. 7a and 7b illustrate a verification example of evaluation results of an accelerated lifetime estimation method for predicting the lifetime of a secondary battery according to an embodiment of the present invention.
Figure 7B:
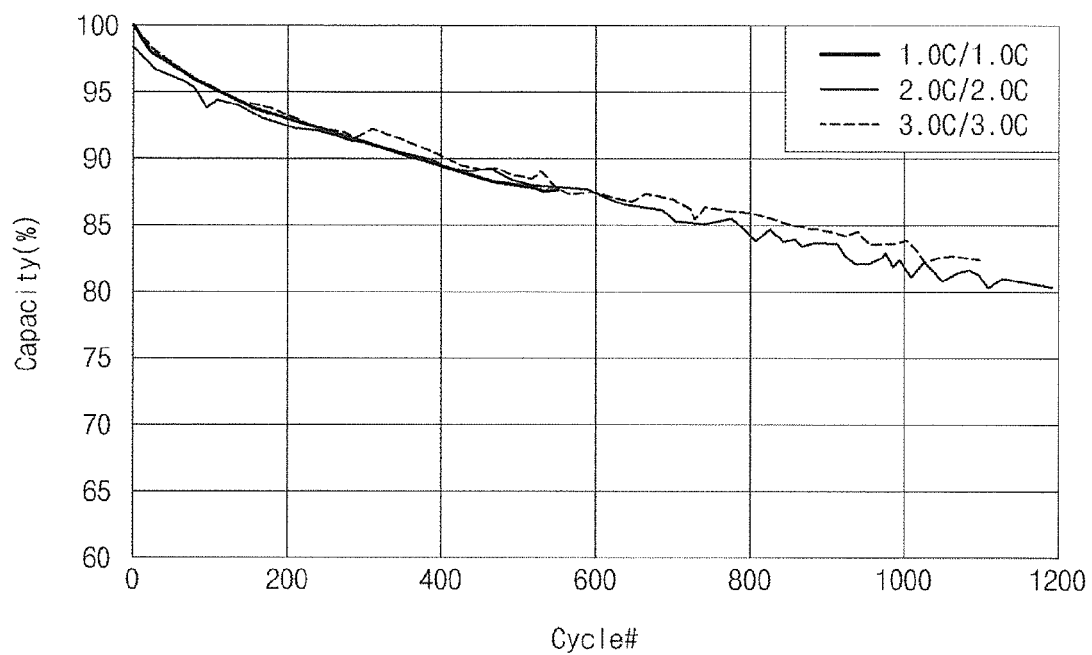

FIGS. 7a and 7b illustrate a verification example of evaluation results of an accelerated lifetime estimation method for predicting the lifetime of a secondary battery according to an embodiment of the present invention.

As shown in FIG. 7a, a number of normal lifetime tests are conducted for approximately 500 cycles, and a number of accelerated lifetime tests are conducted for approximately 900 cycles.

Here, the X axis indicates the number of charge and/or discharge cycles and the Y axis indicates capacity (mAh). In addition, in the normal lifetime tests, charge and/or discharge currents (C-rate) are 1.0 C-1.0 C, and in the accelerated lifetime tests, charge and/or discharge currents (C-rate) are 2.0 C-2.0 C and 3.0 C-3.0 C. Here, the values of the charge and/or discharge currents (C-rate) are provided only for a better understanding of the present invention, but aspects of the present invention are not limited thereto.

As shown in FIG. 7b, if the acceleration factor (AF) is applied to the accelerated lifetime test data, the normal lifetime test data and the accelerated lifetime test data demonstrate the same capacity change tendency. Therefore, it is considered that the accelerated lifetime estimation method according to an embodiment of the present invention is highly reliable. Here, the X axis indicates the number of charge and/or discharge cycles and the Y axis indicates capacity (%). The unit of the X axis may be the same as that of the X axis shown in FIG. 6e.

Figure 8A:
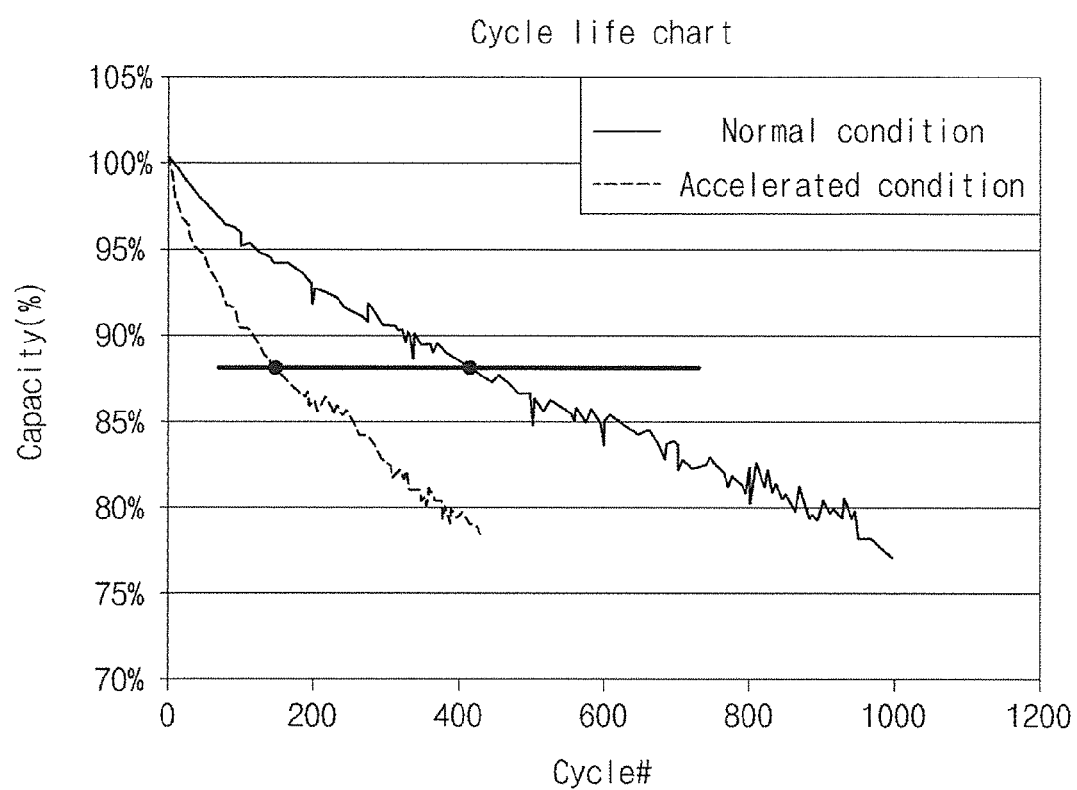
FIGS. 8a and 8b illustrate another verification example of evaluation results of an accelerated lifetime estimation method for predicting the lifetime of a secondary battery according to an embodiment of the present invention.
Figure 8B:
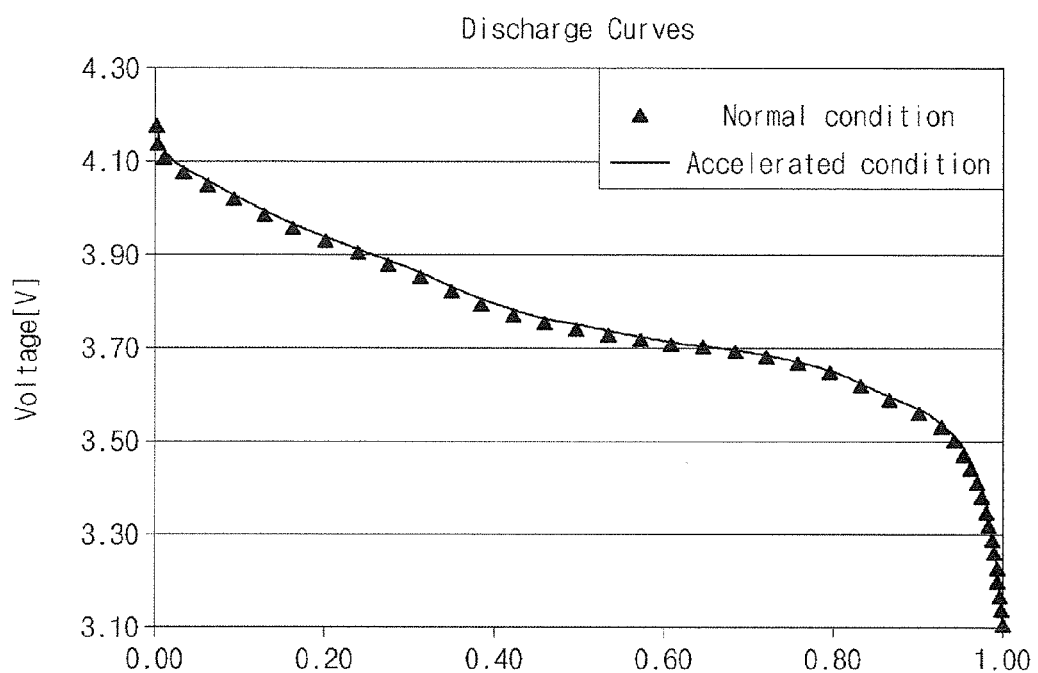

FIGS. 8a and 8b illustrate another verification example of evaluation results of an accelerated lifetime estimation method for predicting the lifetime of a secondary battery according to an embodiment of the present invention.

As shown in FIG. 8a, normal lifetime test data and accelerated lifetime test data are obtained, respectively. Here, the X axis indicates the number of cycles and the Y axis indicates capacity (%). In addition, a slope associated with the capacity relative to the number of cycles of the accelerated lifetime test data is greater than that of the capacity relative to the number of cycles of the normal lifetime test data. Therefore, the secondary battery deteriorates faster in accelerated lifetime tests than in normal lifetime tests.

As shown in FIG. 8b, discharge characteristics are measured from the same capacity in the normal lifetime test data and the accelerated lifetime test data, and then normalized to derive the same discharge characteristic curve. That is to say, even if deteriorating conditions for normal lifetime tests and accelerated lifetime tests are different from each other, the secondary battery has the same deterioration mechanism. The discharge curve is one electrochemical way for demonstrating that the deterioration mechanism is substantially the same.

In addition, in the present invention, in order to verify the deterioration mechanism as being substantially the same, the secondary battery is disassembled for analysis and verification. For example, increasing rates in contact resistance of a negative electrode, a deactivated region and charge transfer resistance, and an increasing rate in film resistance of a positive electrode were analyzed and verified, and the results thereof showed that the same characteristics were observed from the batteries used in normal lifetime tests and accelerated lifetime tests.

As described above, according to the embodiments of the present invention, it was confirmed that there was an error rate of approximately 5% or less or 100 cycles or less between capacity values based on the accelerated lifetime estimation method of the secondary battery and capacity values based on the normal lifetime estimation method of the secondary battery.

Therefore, the prediction of the lifetime of the secondary battery based on the accelerated lifetime estimation device and the method thereof according to the present invention is highly reliable.

Figure 9A:
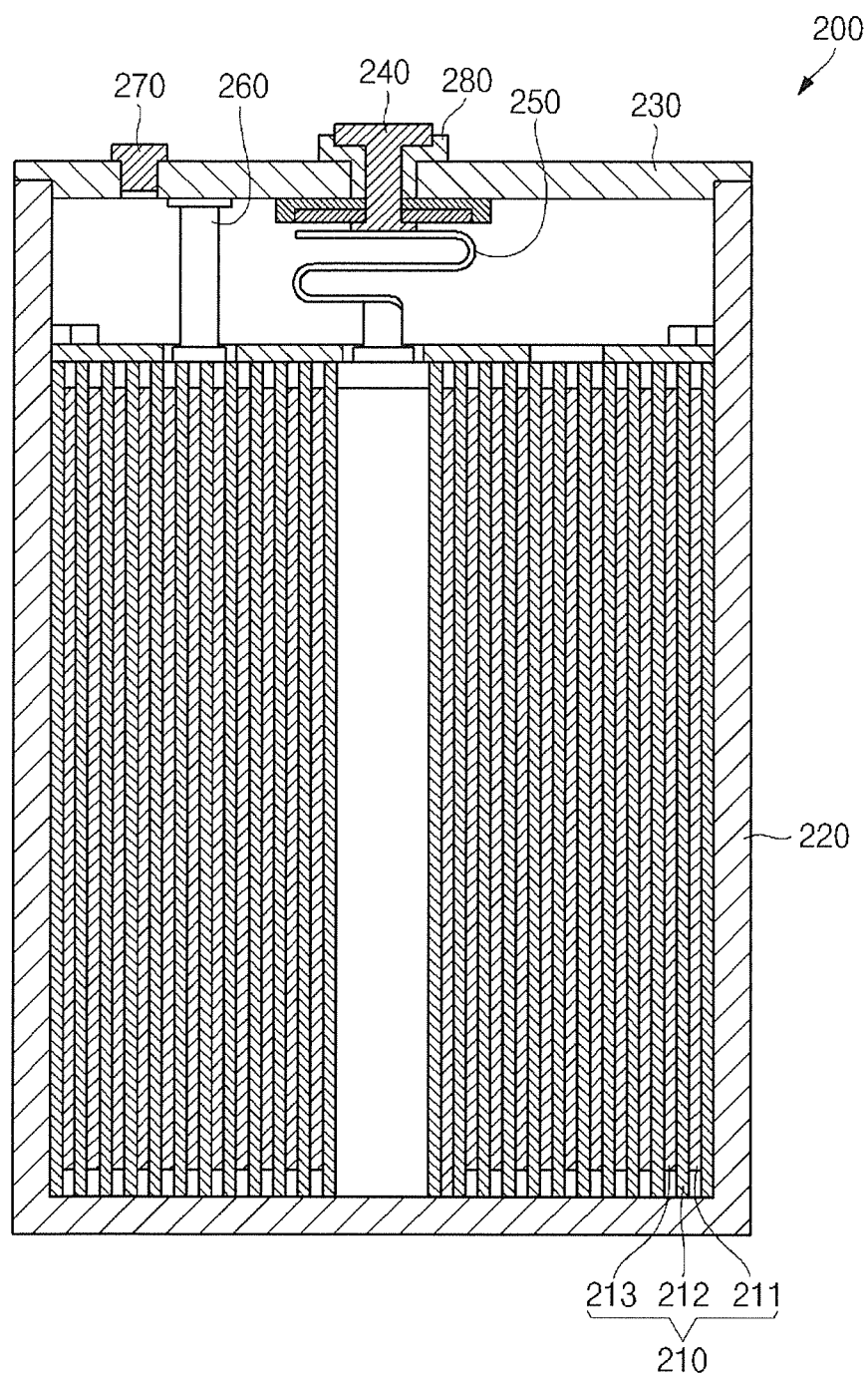
FIGS. 9a, 9b, and 9c are views illustrating examples of a prismatic battery, a pouch type battery, and a cylindrical battery.
Figure 9B:
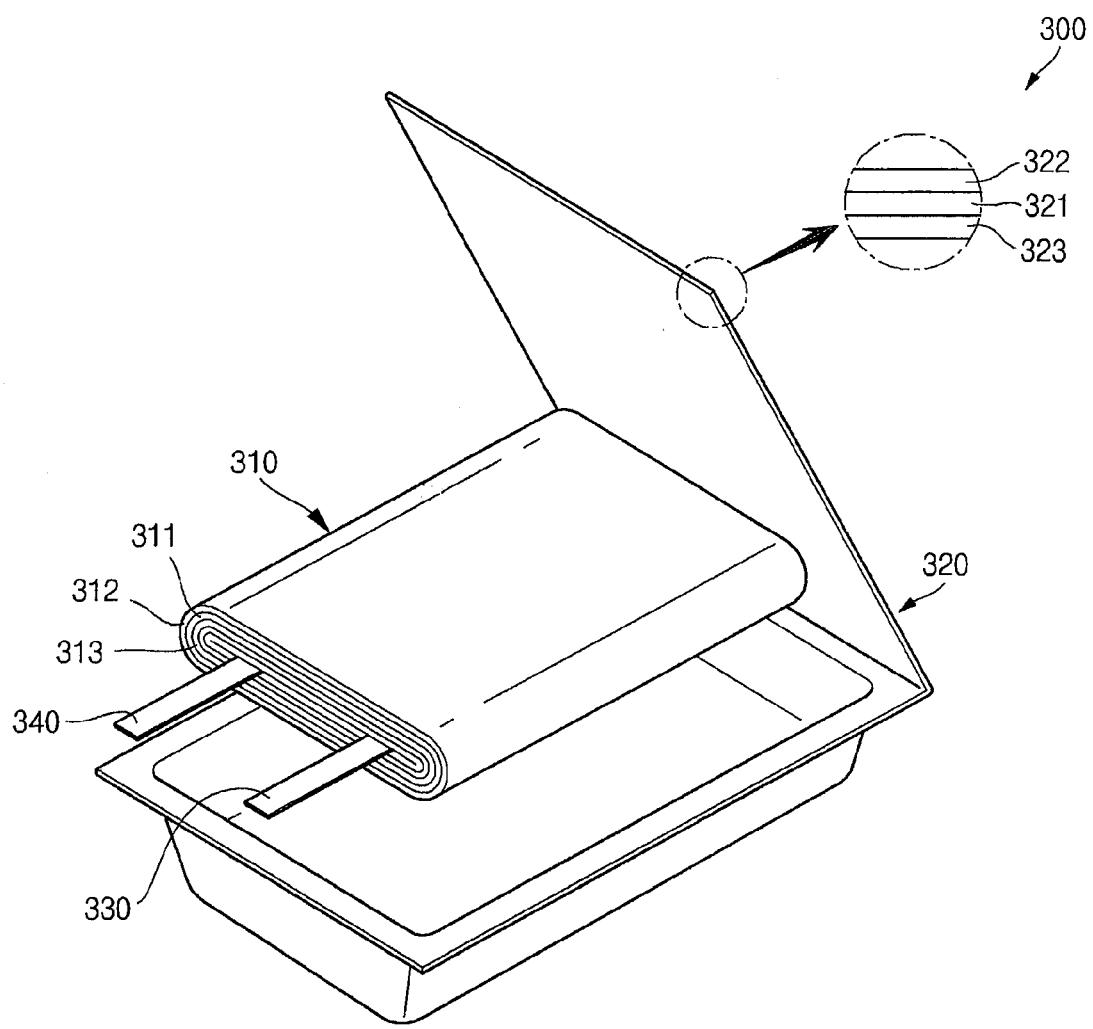
Figure 9C:
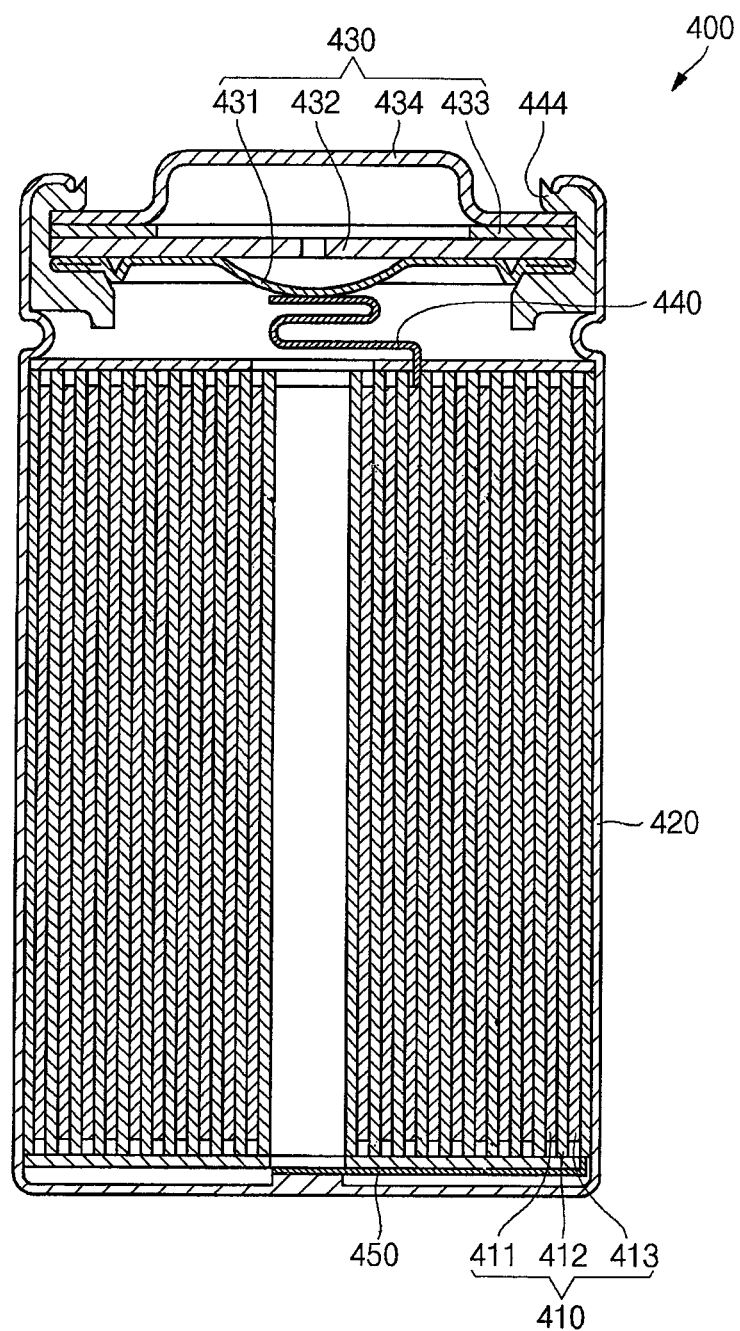

FIGS. 9a, 9b, and 9c are views illustrating examples of a prismatic battery, a pouch type battery, and a cylindrical battery.

As shown in FIG. 9a, the prismatic battery 200 includes an electrode assembly 210 having a positive electrode 211, a separator 212, and a negative electrode 213 stacked therein; a prismatic case 220 accommodating the electrode assembly 210 with an electrolyte (not shown); a cap plate 230 sealing the prismatic case 220; an electrode terminal 240 coupled to the cap plate 230; a positive electrode tab 260 connecting the cap plate 230 to the electrode assembly 210, specifically to the positive electrode 211; and a negative electrode tab 250 connecting the electrode terminal 240 to the electrode assembly 210, specifically to the negative electrode 213. In FIG. 9a, the reference numeral 270 denotes an electrolyte injection plug, and the reference numeral 280 denotes an insulation gasket.

As shown in FIG. 9b, the pouch type battery 300 includes an electrode assembly 310 having a positive electrode 311, a separator 312, and a negative electrode 313 stacked therein; a pouch case 320 accommodating the electrode assembly 310 with an electrolyte (not shown); a positive electrode cell tab 330 connected to the electrode assembly 310, specifically to the positive electrode 311, and extending to the outside of the pouch case 320; and a negative electrode cell tab 340 connected to the electrode assembly 310, specifically to the negative electrode 313, and extending to the outside of the pouch case 320. Here, the pouch case 320 includes a metal layer 321, a first insulating layer 322 formed on one surface of the metal layer 321, and a second insulating layer 323 formed on the other surface of the metal layer 321.

As shown in FIG. 9c, the cylindrical battery 400 includes an electrode assembly 410 having a positive electrode 411, a separator 412, and a negative electrode 413 stacked therein; a cylindrical case 420 accommodating the electrode assembly 410 with an electrolyte (not shown); a cap assembly 430 sealing the cylindrical case 420; a positive electrode tab 440 electrically connecting the electrode assembly 410, specifically the positive electrode 411, with the cap assembly 430; and a negative electrode tab 450 electrically connecting the electrode assembly 410, specifically the negative electrode 413, with the cylindrical case 420. Here, the cap assembly 430 includes an inversion plate 431 connected to the positive electrode tab 440, wherein the inversion plate 431 is structured to be inverted due to increased internal pressure by an over-charge; a circuit board 432 electrically connected to the inversion plate 431 and cutting off an electrical path when the inversion plate 431 is inverted; a conductive ring 433 electrically connected to the circuit board 432; a cap terminal 434 electrically connected to the conductive ring 433; and an insulation gasket 444 insulating the inversion plate 431, the circuit board 432, the conductive ring 433, and the cap terminal 434 from the cylindrical case 420. Here, the inversion plate 431 and the circuit board 432 may be referred to as a current interrupting device, which prevents the cylindrical battery 400 from being over-charged or over-discharged.

Figure 10:
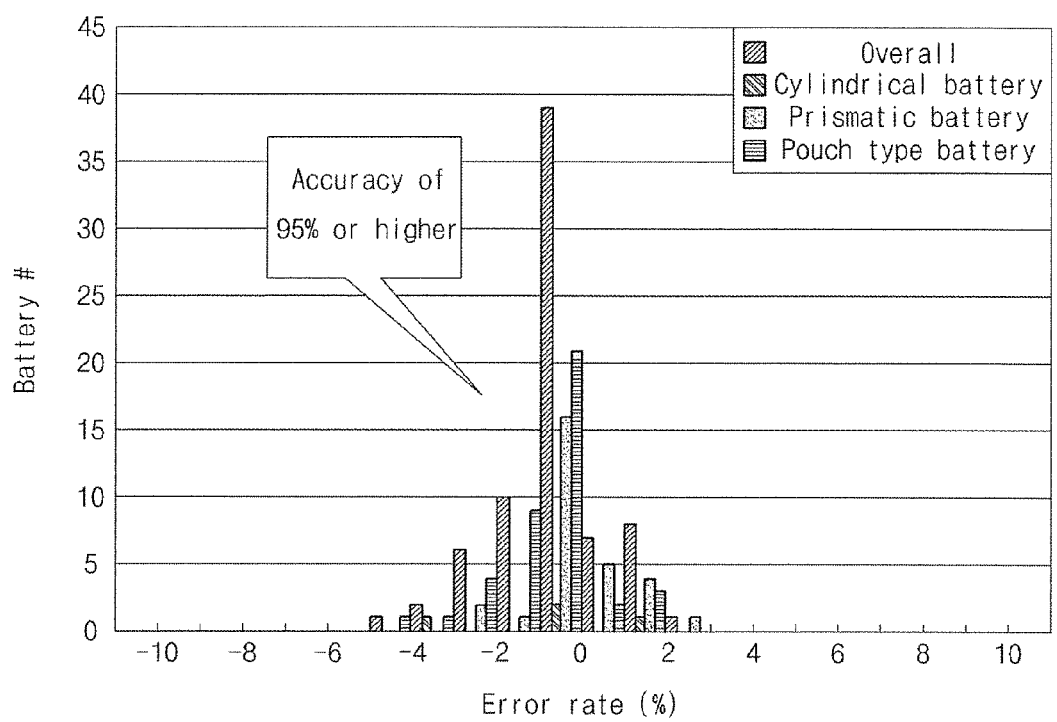
FIG. 10 is a graph illustrating error rates of the accelerated lifetime estimation method for predicting the lifetime of a secondary battery according to an embodiment of the present invention.

FIG. 10 is a graph illustrating error rates depending on the accelerated lifetime estimation method for predicting the lifetime of a secondary battery according to an embodiment of the present invention.

As shown in FIG. 10, a prismatic battery, a pouch type battery, and a cylindrical battery were subjected to normal lifetime tests and accelerated lifetime tests, and the test results showed that there was an error rate of approximately 5% or less in the capacity between the normal and accelerated lifetime tests. That is to say, the normal lifetime value estimated by the accelerated lifetime test according to the embodiments of the present invention, has an accuracy and reliability of 95% or higher. The test results are provided only for a better understanding of the present invention, and the normal lifetime value estimated by the embodiments of the present invention may have an accuracy and reliability of 95% or higher according to the component materials, composition ratio, or capacity of the secondary battery.

Figure 11:
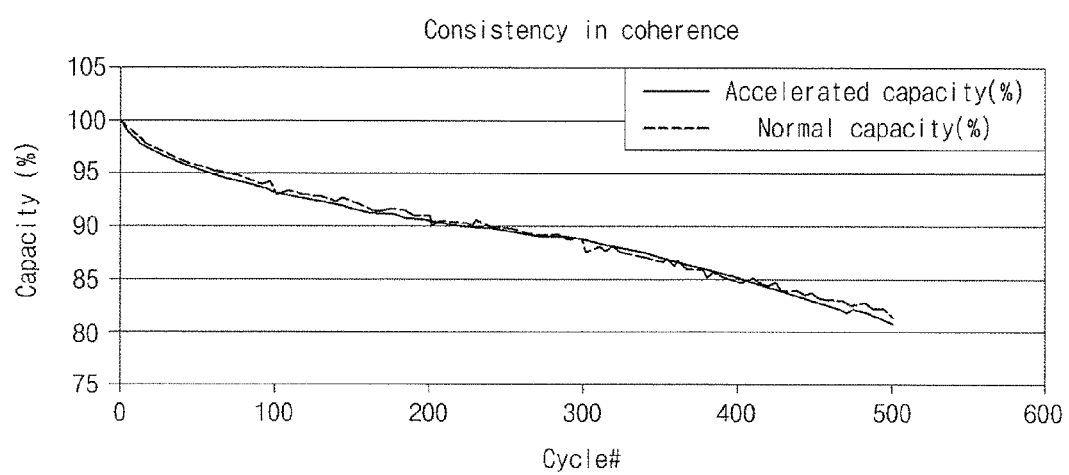
FIG. 11 is a graph illustrating the coherence between normal capacity and accelerated capacity.

FIG. 11 is a graph illustrating consistency in coherence between normal capacity and accelerated capacity, in which the X axis indicates the number of cycles and the Y axis indicates capacity (%).

As shown in FIG. 11, when the accelerated capacity graph and the normal capacity graph are substantially identical with each other, it is defined that there is consistency in coherence between an accelerated capacity and a normal capacity. Here, the accelerated capacity is obtained by obtaining parameters and an acceleration factor from the accelerated lifetime test data, and the normal capacity is obtained by a conventional method.

However, when the accelerated capacity graph and the normal capacity graph are not identical with each other, it is defined that there is inconsistency in coherence between an accelerated capacity and a normal capacity.

The inconsistency in coherence usually occurs in the terminal life stage. The inconsistency in coherence may be caused by inappropriate conditions in accelerated lifetime tests, including charge and/or discharge currents (C-rate), charge and/or discharge cut-off voltages, temperature, shelf time, and so on. Therefore, it is desirable to empirically set optimal accelerated lifetime test conditions depending on types and characteristics of various batteries. As described above, in a case where there is no consistency in coherence, the accelerated lifetime test conditions are not utilized.

Table 1 below shows results of lifetime tests conducted on prismatic batteries, for example, while varying charge and/or discharge currents (C-Rate) and charge and/or discharge cut-off voltages. Since characteristics of prismatic batteries sold for various customers are different, it is important to search optimal charge and/or discharge currents (C-Rate), charge and/or discharge cut-off voltages, and acceleration factors (AF) suited to the prismatic batteries for various customers. Several typical examples are listed in Table 1.

TABLE 1

| Type | Conditions | | Acceleration Factor (AF) | Evaluation Time (day) | |
|---|---|---|---|---|---|
| | C-rate | Cut-off | | | |
| 'A' customer oriented | 2.0C/2.0C | 3.5 V | 2.0 | 30 | Optimal |
| | 2.5C/2.5C | 3.5 V | 7.0 | — | — |
| 'B' customer oriented | 2.0C/2.0C | 3.0 V | 2.3 | 27 | Optimal |
| | 2.0C/2.5C | 3.0 V | 7.0 | — | — |
| 'C' customer oriented | 2.0C/2.0C | 3.1 V | 3.0 | 40 | Optimal |
| | 2.0C/2.5C | 3.1 V | 4.0 | — | — |

Table 2 below shows that normal lifetime test evaluation time periods and accelerated lifetime test evaluation time periods based on the results shown in Table 1.

TABLE 2

| | Normal | | Accelerated | | |
|---|---|---|---|---|---|
| Customer | Evaluation Time (day) | Evaluation Conditions | Evaluation Conditions | Acceleration Factor (AF) | Evaluation Time (day) |
| 'A' customer oriented | 55 | 1.0C/1.0C | 2.0C/2.0C | 2.0 | 30 |
| 'B' customer oriented | 60 | 1.0C/1.0C | 2.0C/2.0C | 2.3 | 27 |
| 'C' customer oriented | 150 | 1.0C/1.0C | 2.0C/2.0C | 3.0 | 40 |

As listed in Table 2, in a case of an 'A' customer oriented secondary battery, for example, while 55 days were taken for normal evaluation, an evaluation time of 30 days was sufficient for accelerated evaluation according to the embodiments of the present invention. In addition, in a case of a 'B' customer oriented secondary battery, while 60 days were taken for normal evaluation, an evaluation time of 27 days was sufficient for accelerated evaluation according to the embodiments of the present invention. In addition, in a case of a 'C' customer oriented secondary battery, while 150 days were taken for normal evaluation, an evaluation time of 40 days was sufficient for accelerated evaluation according to the embodiments of the present invention. Of course, the normal lifetime test evaluation time period and the accelerated lifetime test evaluation time period are provided only for a better understanding of the present invention, but aspects of the present invention are not limited thereto.

As described above, in the accelerated lifetime estimation device and method thereof according to the present invention, the lifetime evaluation time period of the secondary battery can be greatly reduced, compared to the conventional lifetime estimation device and method thereof.

Table 3 below shows normal evaluation time periods and accelerated evaluation time periods conducted on pouch type batteries. Here, normal and accelerated lifetime tests were conducted according to product characteristics of the pouch type batteries, rather than customer oriented type. In a case of an 'A' group, a negative electrode active material relative to a positive electrode active material was 1.6 times or greater and a volume energy density was 500 Wh/L. In a case of an 'B' group, a negative electrode active material relative to a positive electrode active material was 1.6 times or less, and a current density ranges from 2.8 to 2.99. In a case of an 'C' group, a negative electrode active material relative to a positive electrode active material was 1.6 times or less and a current density was 2.8 or less.

TABLE 3

| | Normal Conditions | | Accelerated Conditions | | Evaluation |
|---|---|---|---|---|---|
| Group | Evaluation Time (day) | Evaluation Conditions | Evaluation Conditions | Acceleration Factor (AF) | Time (day) |
| A | 90 | 1.0C/1.0C | 1.9C~2.3C | 3.0 | 30 |
| B~C | 76 | 1.0C/1.5C | 2.3C~2.5C | 2.8 | 27 |

As listed in Table 3, in a case of an 'A' group secondary battery, for example, while 90 days were taken for normal evaluation, an evaluation time of 30 days was sufficient for accelerated evaluation according to the embodiments of the present invention. In addition, in cases of 'B' and 'C' group batteries, while 76 days were taken for normal evaluation, an evaluation time of 27 days was sufficient for accelerated evaluation according to the present invention. As described above, the normal lifetime test evaluation time period and the accelerated lifetime test evaluation time period are provided only for a better understanding of the present invention, but aspects of the present invention are not limited thereto.

As described above, in the accelerated lifetime estimation device and method thereof according to the embodiments of the present invention, the lifetime evaluation time period of the secondary battery can be greatly reduced, compared to the conventional lifetime estimation device and method thereof.

Table 4 below shows results of lifetime tests conducted on cylindrical batteries, for example, using an interval method while varying temperature and shelf time.

TABLE 4

| Conditions | | | | |
|---|---|---|---|---|
| Temperature (° C.) | Shelf Time (day) | Acceleration Factor (AF) | Evaluation Time (day) | Analysis |
| 30 | 8 | 1.4 | 71 | — |
|  | 48 | 1.0 | 86 | — |
| 40 | 8 | 1.5 | 57 | — |
|  | 48 | 1.3 | 70 | — |
| 50 | 8 | 2.0 | 43 | Optimal |
|  | 48 | 1.7 | 53 | — |
| 60 | 8 | 3.0 | 30 | — |
|  | 48 | 1.7 | 51 | — |

As listed in Table 4, in cases of cylindrical batteries, optimal conditions were a temperature of 50° C., and a shelf time of 8 days. The evaluation time period was reduced from 90 days under normal conditions to 43 days under accelerated conditions. As described above, the normal lifetime test evaluation time period and the accelerated lifetime test evaluation time period are provided only for a better understanding of the present invention, but aspects of the present invention are not limited thereto.

Table 5 below shows results of accelerated lifetime tests conducted on cylindrical batteries at room temperature. Here, a lithium cobalt oxide (LCO) type cylindrical battery including a large amount of cobalt (Co) as a positive electrode active material was selected as the cylindrical battery to be evaluated.

TABLE 5

| Type | Conditions | Acceleration Factor (AF) | Evaluation Time (day) | |
|---|---|---|---|---|
| A type | 2.0C/2.0C | 1.5 | 30 | Applicable |
|  | 2.0C/2.0C | 2.0 | 23 | — |
| B type | 2.5C/2.5C | 2.0 | 22 | — |
|  | 1.0C/2.5C | 1.8 | 25 | Applicable |

As listed in Table 5, the results of accelerated lifetime tests conducted on the cylindrical batteries at room temperature showed that the evaluation time period was reduced from 45 days under normal conditions to 30 days and 25 days under accelerated conditions. As described above, the normal lifetime test evaluation time period and the accelerated lifetime test evaluation time period are provided only for a better understanding of the present invention, but aspects of the present invention are not limited thereto.

While the present invention has been particularly shown and described with reference to exemplary embodiments of an accelerated lifetime estimation device for predicting the lifetime of a secondary battery and a method thereof, it will be understood by those of ordinary skill in the art that various changes in form and details may be made therein without departing from the spirit and scope of the present invention as defined by the following claims and its equivalents. It is therefore desired that the present embodiments be considered in all respects as illustrative and not restrictive, reference being made to the appended claims rather than the foregoing description to indicate the scope of the invention.

What is claimed is:

1. A device for estimating a lifetime of a battery to evaluate a battery design of the battery in an accelerated amount of time, the device comprising:

a battery evaluation device configured to charge and discharge the battery and to measure first battery life test data and second battery life test data from the battery;

an input unit configured to receive the first battery life test data and the second battery life test data of the battery from the battery evaluation device, the first battery life test data and the second battery life test data corresponding to different conditions in the accelerated amount of time; and a processor operatively coupled with the input unit, the processor being configured to determine one or more parameters from the first battery life test data and the second battery life test data, calculate an acceleration factor (AF) correlating the first battery life test data and the second battery life test data in accordance with performing one or more mathematical operations on the one or more parameters, and predict an estimated lifetime of the battery in accordance with the AF and the second battery life test data to evaluate the battery design, wherein the processor comprises:

a parameter extractor configured to extract the one or more parameters from the first battery life test data and the second battery life test data;

an acceleration factor calculator configured to calculate the AF in accordance with the one or more parameters; and a prediction unit configured to predict the estimated lifetime of the battery in accordance with the AF, and wherein the acceleration factor calculator is configured to calculate the AF by using an equation associated with a semi-empirical lifetime model that is defined as $$AF = \frac{t(\text{normal})}{t(\text{accelerated})} = \frac{C-\text{rate}(a)}{C-\text{rate}(n)} \times \frac{\text{Swing}(n)}{\text{Swing}(a)} \times \left(\frac{A_a(C-\text{rate}(a), \text{Swing}(a))}{A_n(C-\text{rate}(n), \text{Swing}(n))}\right)^2,$$

where t(normal) is a normal lifetime test time period for a first battery lifetime test for obtaining the first battery life test data, t(accelerated) is an accelerated lifetime test time period for a second battery lifetime test for obtaining the second battery life test data, C-rate(n) is a charge and/or discharge current used in the first battery lifetime test, C-rate(a) is a charge and/or discharge current used in the second battery lifetime test, Swing(n) is a charge and/or discharge cut-off voltage used in the first battery lifetime test, Swing(a) is a charge and/or discharge cut-off voltage used in the second battery lifetime test, and $A_n$ is a slope parameter depending on the charge and/or discharge current and the charge and/or discharge cut-off voltage at the normal lifetime test time and $A_a$ is a slope parameter depending on the charge and/or discharge current and the charge and/or discharge cut-off voltage at the accelerated lifetime test time, from among the one or more parameters, wherein the first battery life test data are obtained by charging and/or discharging a first battery with a first current, and the second battery life test data are obtained by charging and/or discharging a second battery with a second current greater than the first current.

2. The device of claim 1, wherein the first battery life test data are obtained by charging and/or discharging the first battery at a first temperature for a first period, and the second battery life test data are obtained by charging and/or discharging the second battery at a second temperature for a second period, the second temperature being higher or lower than the first temperature, or the second temperature being equal to the first temperature, and the second period being shorter or longer than the first period, or the second period being equal to the first period.

3. The device of claim 1, wherein each of the first battery life test data and the second battery life test data comprise at least one of cycle numbers, residual capacity ratios, charge and/or discharge currents, or charge and/or discharge cut-off voltages.

4. The device of claim 1, wherein the parameter extractor is configured to determine a slope parameter for a residual capacity ratio relative to cycle numbers in accordance with the first battery life test data and the second battery life test data.

5. The device of claim 1, wherein the first battery life test data includes cycle and capacity values obtained by charging and/or discharging the first battery with a first voltage, and the second battery life test data includes cycle and capacity values obtained by charging and/or discharging the second battery with a second voltage, the second voltage being higher or lower than the first voltage, or the second voltage being equal to the first voltage.

6. The device of claim 1, wherein the processor is configured to multiply the second battery life test data by the AF to determine the estimated lifetime of the battery.

7. The device of claim 1, further comprising a storage device configured to store one or more of the first battery life test data, the second battery life test data, the one or more parameters, the AF, or the estimated lifetime of the battery.

8. A device for estimating a lifetime of a battery to evaluate a battery design of the battery in an accelerated amount of time, the device comprising:
a battery evaluation device configured to charge and discharge the battery and to measure first battery life test data and second battery life test data from the battery;
an input unit configured to receive the first battery life test data and the second battery life test data of the battery from the battery evaluation device, the first battery life test data and the second battery life test data corresponding to different conditions in the accelerated amount of time; and
a processor operatively coupled with the input unit, the processor being configured to determine one or more parameters from the first battery life test data and the second battery life test data, calculate an acceleration factor (AF) correlating the first battery life test data and the second battery life test data in accordance with performing one or more mathematical operations on the one or more parameters, and predict an estimated lifetime of the battery in accordance with the AF and the second battery life test data to evaluate the battery design, wherein the processor comprises:
a parameter extractor configured to extract the one or more parameters from the first battery life test data and the second battery life test data;
an acceleration factor calculator configured to calculate the AF in accordance with the one or more parameters; and
a prediction unit configured to predict the estimated lifetime of the battery in accordance with the AF, and
wherein the acceleration factor calculator is configured to calculate the AF by using an equation associated with a statistical lifetime analysis model that is defined as $$AF = k \times \frac{C-\text{rate}(a)}{C-\text{rate}(n)} \text{ or } k \times (\text{time\_ratio}),$$

where C-rate(n) is a charge and/or discharge current used in a normal lifetime test for obtaining the first battery life test data, C-rate(a) is a charge and/or discharge current used in an accelerated lifetime test for obtaining the second battery life test data, time_ratio is a ratio of an evaluation time period to initial 100 cycles, and k is a deteriorated acceleration factor that is calculated by using an equation defined as $$k = \frac{\sum [b_n x_a y_a - a_n b_n x_a + b_n^2 x_n x_a]}{\sum [b_n x_a]^2},$$

where subscript n denotes a normal lifetime test condition corresponding to the normal lifetime test, subscript a denotes an accelerated lifetime test condition corresponding to the accelerated lifetime test, x denotes cycle numbers, y denotes a residual capacity ratio, $b_n$ denotes a slope between data of battery capacity and cycle numbers at the normal lifetime test, and $a_n$ denotes a y-intercept, from among the one or more parameters, wherein the first battery life test data are obtained by charging and/or discharging a first battery with a first current, and the second battery life test data are obtained by charging and/or discharging a second battery with a second current greater than the first current.

9. A method of estimating a lifetime of a battery to evaluate a battery design of the battery in an accelerated amount of time, the method comprising:
charging and discharging, by a battery evaluation device, the battery;
measuring, by the battery evaluation device, first battery life test data and second battery life test data of the battery in accordance with the charging and discharging the battery;
determining one or more parameters from the first battery life test data and the second battery life test data of the battery, the first battery life test data and the second battery life test data corresponding to different conditions in the accelerated amount of time;
calculating an acceleration factor (AF) that correlates the first battery life test data and the second battery life test data in accordance with performing one or more mathematical operations on the one or more parameters;
predicting an estimated lifetime of the battery in accordance with the AF and the second battery life test data; and evaluating the battery design in accordance with the estimated lifetime of the battery, wherein the determining the AF comprises calculating the AF by using the one or more parameters in accordance with a semi-empirical lifetime model or a statistical lifetime analysis model of the battery, and wherein the calculating the AF comprises calculating the AF by using an equation associated with the semi-empirical lifetime model that is defined as $$AF = \frac{t(\text{normal})}{t(\text{accelerated})} = \frac{C-\text{rate}(a)}{C-\text{rate}(n)} \times \frac{\text{Swing}(n)}{\text{Swing}(a)} \times \left(\frac{A_a(C-\text{rate}(a), \text{Swing}(a))}{A_n(C-\text{rate}(n), \text{Swing}(n))}\right)^2,$$

where t(normal) is a normal lifetime test time period for a first battery lifetime test for obtaining the first battery life test data, t(accelerated) is an accelerated lifetime test time period for a second battery lifetime test for obtaining the second battery life test data, C-rate(n) is a charge and/or discharge current used in the first battery lifetime test, C-rate(a) is a charge and/or discharge current used in the second battery lifetime test, Swing(n) is a charge and/or discharge cut-off voltage used in the first battery lifetime test, Swing(a) is a charge and/or discharge cut-off voltage used in the second battery lifetime test, and $A_n$ is a slope parameter depending on the charge and/or discharge current and the charge and/or discharge cut-off voltage at the normal lifetime test time and $A_a$ is a slope parameter depending on the charge and/or discharge current and the charge and/or discharge cut-off voltage at the accelerated lifetime test time, from among the one or more parameters, wherein the method further comprises:
  obtaining the first battery life test data by charging and/or discharging a first battery with a first current; and
  obtaining the second battery life test data by charging and/or discharging a second battery with a second current greater than the first current.

10. The method of claim 9, further comprising:
  obtaining the first battery life test data by charging and/or discharging the first battery at a first temperature for a first period; and
  obtaining the second battery life test data by charging and/or discharging the second battery at a second temperature for a second period,
  wherein the second temperature is higher or lower than the first temperature, or the second temperature is equal to the first temperature, and the second period is shorter or longer than the first period, or the second period is equal to the first period.

11. The method of claim 9, wherein each of the first battery life test data and the second battery life test data comprise at least one of cycle numbers, residual capacity ratios, charge and/or discharge currents, or charge and/or discharge cut-off voltages.

12. The method of claim 9, wherein the determining the one or more parameters comprises determining a slope parameter for a the residual capacity ratio relative to cycle numbers in accordance with the first battery life test data and the second battery life test data.

13. The method of claim 9, wherein the predicting the estimated lifetime of the battery comprises multiplying the second battery life test data by the AF to determine the estimated lifetime of the battery.

14. A method of estimating a lifetime of a battery to evaluate a battery design of the battery in an accelerated amount of time, the method comprising:
  charging and discharging, by a battery evaluation device, the battery;
  measuring, by the battery evaluation device, first battery life test data and second battery life test data of the battery in accordance with the charging and discharging the battery;
  determining one or more parameters from the first battery life test data and the second battery life test data of the battery, the first battery life test data and the second battery life test data corresponding to different conditions in the accelerated amount of time;
  calculating an acceleration factor (AF) that correlates the first battery life test data and the second battery life test data in accordance with performing one or more mathematical operations on the one or more parameters;
  predicting an estimated lifetime of the battery in accordance with the AF and the second battery life test data; and
  evaluating the battery design in accordance with the estimated lifetime of the battery,
  wherein the determining the AF comprises calculating the AF by using the one or more parameters in accordance with a semi-empirical lifetime model or a statistical lifetime analysis model of the battery, and
  wherein the calculating the AF comprises calculating the AF by using an equation associated with the statistical lifetime analysis model that is defined as $$AF = k \times \frac{C-\text{rate}(a)}{C-\text{rate}(n)} \text{ or } k \times (\text{time\_ratio}),$$

where C-rate(n) is a charge and/or discharge current used in a normal lifetime test for obtaining the first battery life test data, C-rate(a) is a charge and/or discharge current used in an accelerated lifetime test for obtaining the second battery life test data, time_ratio is a ratio of an evaluation time period to initial 100 cycles, and k is a deteriorated acceleration factor that is calculated using an equation defined as $$k = \frac{\sum [b_n x_a y_a - a_n b_n x_a + b_n^2 x_n x_a]}{\sum [b_n x_a]^2},$$

where subscript n denotes a normal lifetime test condition corresponding to the normal lifetime test, subscript a denotes an accelerated lifetime test condition corresponding to the accelerated lifetime test, x denotes cycle numbers, y denotes a residual capacity ratio, $b_n$ denotes a slope between data of battery capacity and cycle numbers at the normal lifetime test, and $a_n$ denotes a y-intercept, from among the one or more parameters, wherein the method further comprises:
  obtaining the first battery life test data by charging and/or discharging a first battery with a first current; and
  obtaining the second battery life test data by charging and/or discharging a second battery with a second current greater than the first current.

\* \* \* \* \*